United States Patent
Probst

(10) Patent No.: US 8,610,205 B2
(45) Date of Patent: Dec. 17, 2013

(54) INTER-POLY DIELECTRIC IN A SHIELDED GATE MOSFET DEVICE

(75) Inventor: Dean E. Probst, West Jordan, UT (US)

(73) Assignee: Fairchild Semiconductor Corporation, South Portland, ME (US)

(*) Notice: Subject to any disclaimer, the term of this patent is extended or adjusted under 35 U.S.C. 154(b) by 2 days.

(21) Appl. No.: 13/049,655

(22) Filed: Mar. 16, 2011

(65) Prior Publication Data

US 2012/0235229 A1  Sep. 20, 2012

(51) Int. Cl.
*H01L 29/66* (2006.01)

(52) U.S. Cl.
USPC ............ 257/333; 257/678; 257/E29.201; 257/E21.655; 438/270; 438/587

(58) Field of Classification Search
USPC ........ 257/139, 203, 213, 330, 332, 333, 678, 257/E29.2, E29.201, E21.655; 438/151, 438/153, 259, 270, 271, 275, 315, 587
See application file for complete search history.

(56) References Cited

U.S. PATENT DOCUMENTS

| | | | |
|---|---|---|---|
| 6,809,375 B2 | 10/2004 | Takemori et al. | |
| 7,319,256 B1* | 1/2008 | Kraft et al. | 257/330 |
| 7,598,144 B2 | 10/2009 | Herrick et al. | |
| 2004/0089910 A1* | 5/2004 | Hirler et al. | 257/500 |
| 2005/0167742 A1 | 8/2005 | Challa et al. | |
| 2008/0090339 A1* | 4/2008 | Herrick et al. | 438/151 |
| 2008/0182376 A1* | 7/2008 | Pattanayak et al. | 438/270 |
| 2009/0321812 A1* | 12/2009 | Toyama et al. | 257/324 |
| 2009/0321817 A1* | 12/2009 | Hunt | 257/330 |
| 2010/0006928 A1* | 1/2010 | Pan et al. | 257/330 |
| 2010/0123189 A1* | 5/2010 | Venkatraman et al. | 257/330 |

* cited by examiner

*Primary Examiner* — William D Coleman
*Assistant Examiner* — Su Kim
(74) *Attorney, Agent, or Firm* — Brake Hughes Bellermann LLP

(57) ABSTRACT

In one general aspect, an apparatus can include a shield dielectric disposed within a trench aligned along an axis within an epitaxial layer of a semiconductor, and a shield electrode disposed within the shield dielectric and aligned along the axis. The apparatus can include a first inter-poly dielectric having a portion intersecting a plane orthogonal to the axis where the plane intersects the shield electrode, and a second inter-poly dielectric having a portion intersecting the plane and disposed between the first inter-poly dielectric and the shield electrode. The apparatus can also include a gate dielectric having a portion disposed on the first inter-poly dielectric.

22 Claims, 10 Drawing Sheets

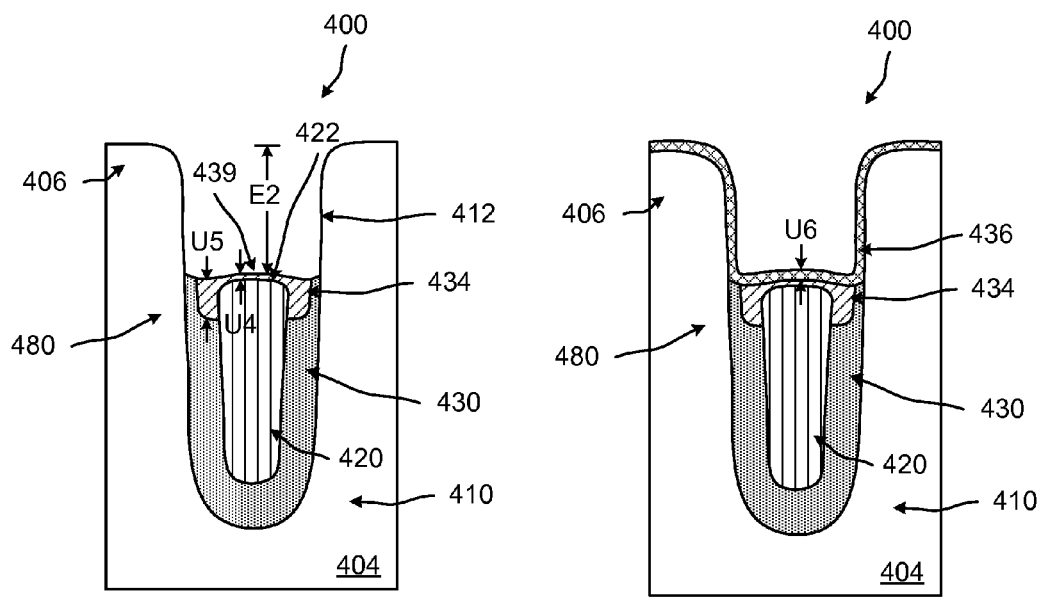
FIG. 4D
FIG. 4E
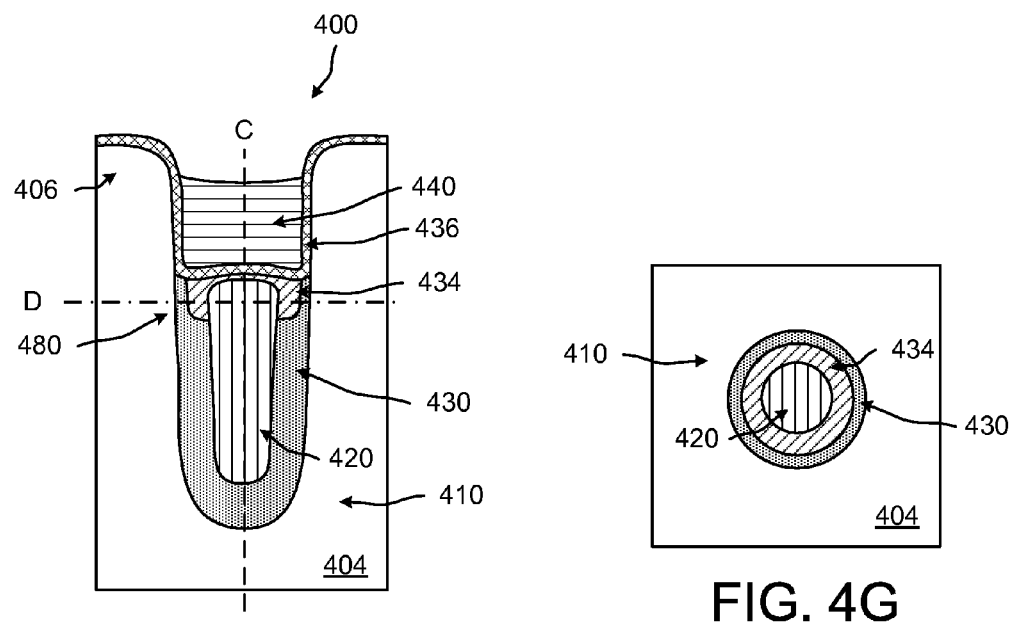
FIG. 4F
FIG. 4G

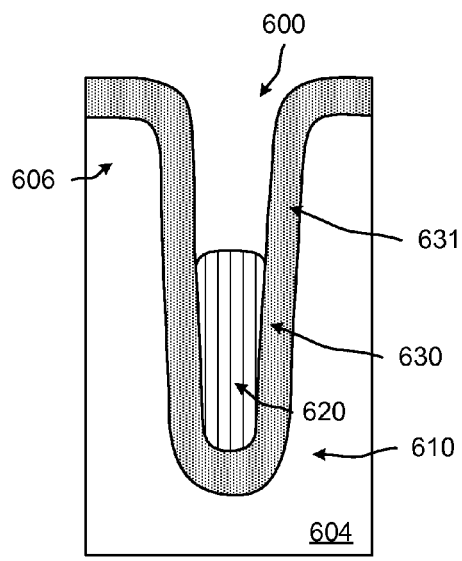
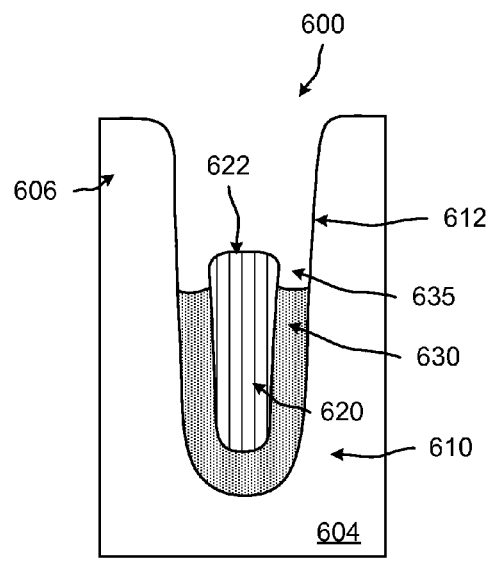
FIG. 6A          FIG. 6B
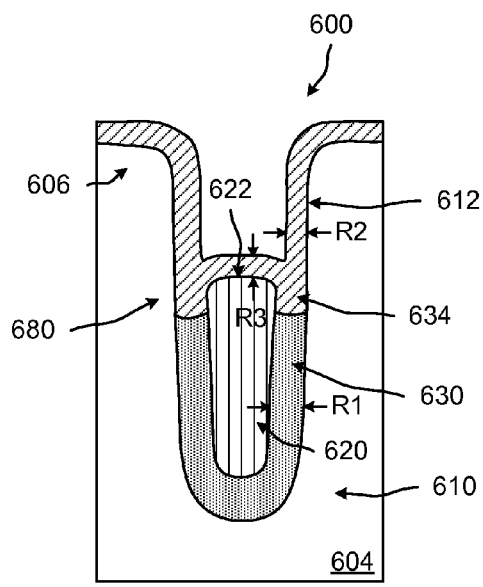
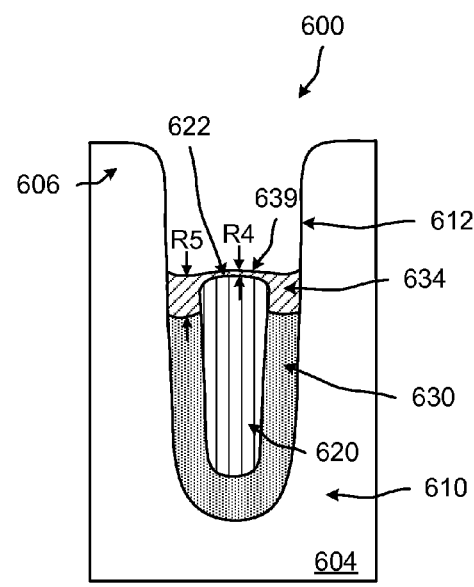
FIG. 6C          FIG. 6D

INTER-POLY DIELECTRIC IN A SHIELDED GATE MOSFET DEVICE

TECHNICAL FIELD

This description relates to an inter-poly dielectric of a metal-oxide-semiconductor field-effect transistor (MOSFET) device.

BACKGROUND

Shielded gate trench metal-oxide-semiconductor field-effect transistor MOSFET devices are advantageous in that the shield electrode can be used to reduce the gate-drain capacitance ($C_{gd}$) and/or improve the breakdown voltage of the gate trench MOSFET device. In known shielded gate trench MOSFETs, a trench can include a shield electrode disposed below a gate electrode. The shield electrode can be insulated from adjacent silicon regions by a shield oxide (e.g., shield dielectric) which is generally thicker than a gate oxide (e.g., gate dielectric) around the gate electrode. The gate electrode and the shield electrode can be insulated from one another by a dielectric layer referred to as an inter-poly dielectric (IPD) layer. The IPD layer is generally of sufficient quality and thickness to support the required voltage between the gate electrode and the shield electrode.

Known shielded gate trench MOSFET devices can suffer from a number of drawbacks. First, the gate electrode can have sharp bottom corners which, together with the flat top surface of the shield electrode, can lead to relatively high electric fields in these regions. Second, known methods for forming the IPD layer can introduce an oxide layer on the mesas between trenches. This oxide layer may be removed at some point after the gate electrode has been formed; however, when removing this oxide, etching of the gate oxide down the trench walls can occur, which can result in gate shorts and/or gate leakage. Other known techniques tie formation of the IPD layer to formation of the gate dielectric, and thus the IPD layer thickness may be limited to a set multiple of the gate dielectric thickness. This may not allow for independent optimization of the gate dielectric and/or the IPD layer. Thus, there is a need for an apparatus and method related to formation of a shielded gate trench MOSFET device to address the shortfalls of present technology and to provide other new and innovative features.

SUMMARY

In one general aspect, an apparatus can include a shield dielectric disposed within a trench aligned along an axis within an epitaxial layer of a semiconductor, and a shield electrode disposed within the shield dielectric and aligned along the axis. The apparatus can include a first inter-poly dielectric having a portion intersecting a plane orthogonal to the axis where the plane intersects the shield electrode, and a second inter-poly dielectric having a portion intersecting the plane and disposed between the first inter-poly dielectric and the shield electrode. The apparatus can also include a gate dielectric having a portion disposed on the first inter-poly dielectric.

In another general aspect, an apparatus can include a shield dielectric disposed within a trench aligned along an axis within an epitaxial layer of a semiconductor, and a shield electrode disposed within the shield dielectric and aligned along the axis. The apparatus can include a first inter-poly dielectric having a portion defining a ring aligned along a plane intersecting the shield electrode where the plane is orthogonal to the axis, and a second inter-poly dielectric having a portion disposed between the portion of the first inter-poly dielectric and the shield electrode. The apparatus can also include a gate dielectric having a portion coupled to the first inter-poly dielectric.

In yet another general aspect, a method can include forming a shield electrode within a shield dielectric disposed within a trench of an epitaxial layer of a semiconductor, and removing a first portion of the shield dielectric disposed above the shield electrode so that a second portion of the shield dielectric remains coupled to a wall of the trench. The method can also include forming, within the trench, an inter-poly dielectric having a thickness along the second portion of the shield dielectric less than a combined thickness of the first portion of the shield dielectric and the second portion of the shield dielectric.

The details of one or more implementations are set forth in the accompanying drawings and the description below. Other features will be apparent from the description and drawings, and from the claims.

BRIEF DESCRIPTION OF THE DRAWINGS

FIGS. 4A through 4F are schematic cross-sectional views at various stages of formation of a shielded MOSFET device 400, in accordance with an embodiment.

FIG. 4G is a schematic cross-sectional view of the shielded MOSFET device shown in FIG. 4F.

FIGS. 6A through 6E are schematic cross-sectional views at various stages of formation of a shielded MOSFET device 600, in accordance with an embodiment.

FIG. 6F is a schematic cross-sectional view of the shielded MOSFET device shown in FIG. 6E.

DETAILED DESCRIPTION

Figure 1:
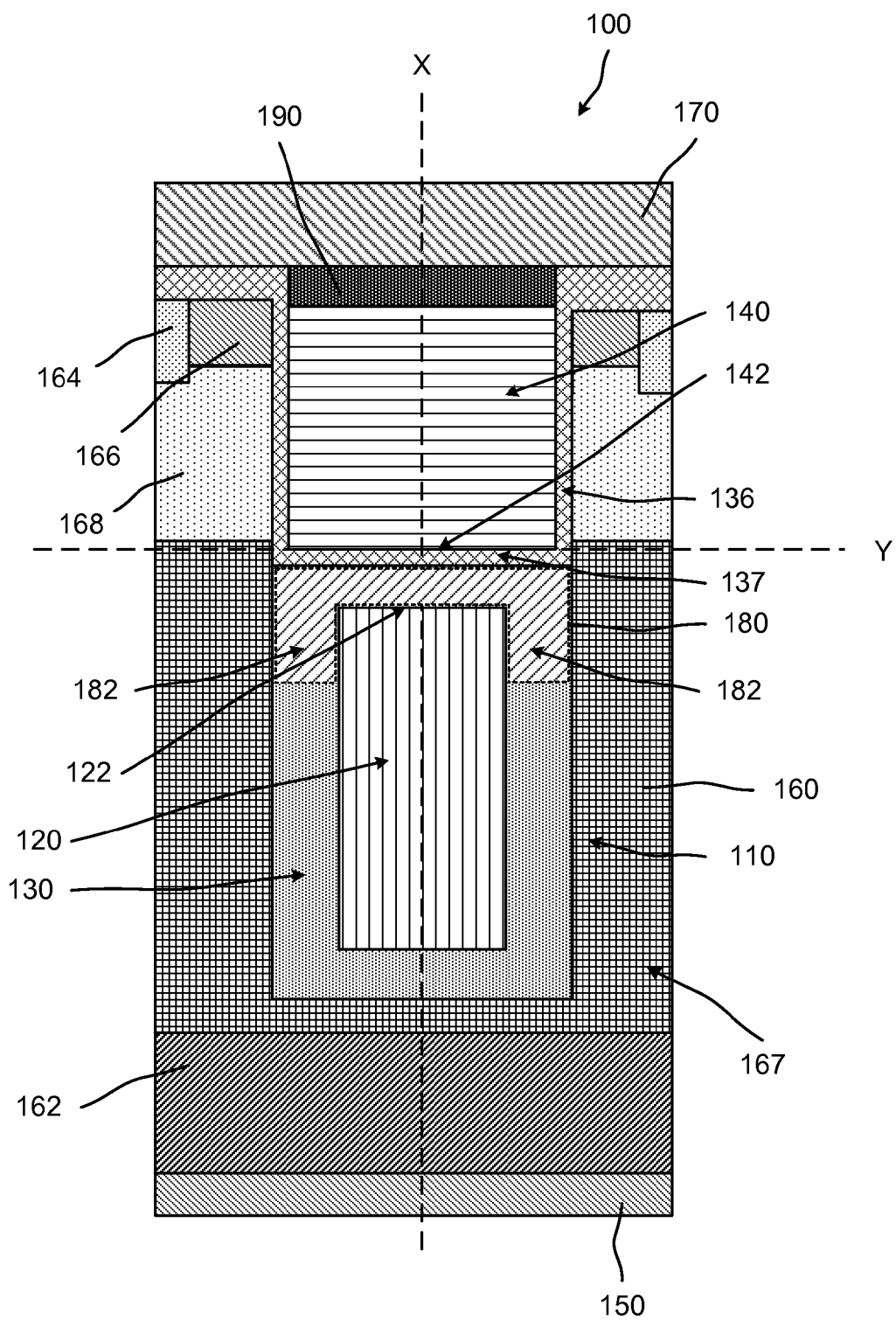
FIG. 1 is a block diagram that illustrates a cross-sectional view of a shielded gate trench metal-oxide-semiconductor field-effect transistor (MOSFET) device, according to an embodiment.

FIG. 1 is a block diagram that illustrates a cross-sectional view of a shielded gate trench metal-oxide-semiconductor field-effect transistor (MOSFET) device 100, according to an embodiment. The shielded gate trench MOSFET device 100 can be referred to as a shielded MOSFET device because the MOSFET device includes a shield electrode 140.

As shown in FIG. 1 an epitaxial layer 160 (e.g., N-type) is disposed over a substrate 162 (e.g., N+ substrate). Source regions 166 (e.g., N+ source regions) and body regions 164 (e.g., heavy body regions, P+ body regions) are formed in body regions 168 (e.g., P-type) which is formed in the epitaxial layer 160. Trench 110 extends through body region 160 and terminates in a drift region 167 within the epitaxial layer 160 (also can be referred to as an epitaxial region) and/or in an N+ substrate (not shown). Trench 110 includes a shield oxide 130 disposed within the trench 110 and around (at least a portion of) a shield electrode 120, and the shield oxide 130 is disposed below a gate electrode 140 surrounded (at least in part) by a gate oxide 136 (also can be referred to as a gate oxide portion). In some embodiments, the shield electrode 120 and/or the gate electrode 140 can be formed using a polysilicon material.

As shown in FIG. 1, a source electrode 170 can be disposed (e.g., deposited, formed) above the shielded MOSFET device 100, and a drain contact 150 can be disposed (e.g., deposited, formed) below the substrate 162. An insulation layer 190 can be disposed between the gate electrode 140 and the source electrode 170. The shielded MOSFET device 100 can be configured to operate (e.g., be activated) by applying a voltage (e.g., a gate voltage, a gate to source voltage) to the gate electrode 140 of the shielded MOSFET device 100, which can turn the shielded MOSFET device 100 on by forming channels adjacent to the gate oxide 136 so that current may flow between the source regions 166 and the drain contact 150.

As shown in FIG. 1, the trench 110, the shield electrode 120, and the gate electrode 140 are aligned (and/or centered) along (e.g., substantially aligned along) a longitudinal axis X. In this embodiment, the trench 110, the shield electrode 120, and the gate electrode 140 are also substantially centered around the longitudinal axis X. The longitudinal axis X can be orthogonal to, or substantially orthogonal to, a plane (or axis) along which the substrate 162, epitaxial layer 160, and so forth, are aligned (and/or centered).

In this embodiment, an inter-poly dielectric (IPD) region (which is represented with a dashed line) within the shielded MOSFET device 100 can be configured with various layers of oxide (which can collectively define an IPD layer). In some embodiments, the IPD region 180 can include a combination of thermal oxides and deposited oxides that are formed within the shielded MOSFET device 100 during processing (e.g., semiconductor processing) of the shielded MOSFET device 100. As represented in FIG. 1, the oxides in the IPD region 180 can be different than (e.g., separately produced from) the shield oxide 130. For example, in some embodiments, one or more oxides included in the IPD region 180 can be formed during process steps that are different than (or separate from) the process steps used to form the shield oxide 130.

The IPD region 180 (or portions thereof) can be formed to eliminate or significantly reduce undesired protrusions (not shown) of the gate electrode 140 that may be formed during a thermal IPD process. In some embodiments, if the gate electrode 140 is formed using a polysilicon material, the protrusions can be polysilicon protrusions. In some embodiments, the protrusions (which aren't shown in FIG. 1) of the gate electrode 140 can extend into regions 182 of the IPD region 180 that, as shown in FIG. 1, are lateral (and/or adjacent) to the shield electrode 120. Accordingly, the protrusions can extend below a top surface 122 of the shield electrode 120 and can define "fangs" with a relative sharp point (when viewed as a cross-section). The protrusions (if present) of the gate electrode 140 can result in a relatively high (and undesirable) input capacitance (e.g., gate to source capacitance ($C_{gs}$) and/or undesirable reverse leakage currents (e.g., gate leakage ($I_{gss}$) currents).

Thus, the formation of the IPD region 180 in accordance with the description herein to eliminate (or reduce) the protrusions can result in a reduced input capacitance and/or a reduced reverse leakage currents. Also, the bottom surface 142 of the gate electrode 140 can be without (or substantially without) protrusions, and aligned along or substantially aligned along plane Y, which is orthogonal to (or substantially orthogonal to) longitudinal axis X. In other words, the bottom surface 142 of the gate electrode 140 can be flat or substantially flat. In some embodiments, the processing associated with the shielded MOSFET device 100 can allow for a thicker field oxide (not shown) outside an array (of MOSFET devices of which the shielded MOSFET device 100 is a part, compared to a process where only the shield oxide 130 is used as a field oxide.

The IPD region 180 of the shielded MOSFET device 100 shown in FIG. 1 can be formed using a variety of processing techniques (e.g., semiconductor processing techniques). For example, in some embodiments, the shield oxide 130 (or at least a portion thereof) can be etched back (e.g., removed) after the shield electrode 120 has been formed within the shielded MOSFET device 100 to expose at least a portion of the silicon wall (e.g., sidewall) of the trench 110 (e.g., the silicon wall defined by the trench 110) and expose at least a portion (e.g., a top portion) of the shield electrode 120. The exposed portion of the shield electrode 120 and exposed silicon (from the etching) can be thermally oxidized (e.g., thermally oxidized to form a thermal oxide layer), and then a deposited oxide (e.g., deposited oxide film, thin deposited oxide) can be used to fill gaps (e.g., gaps where a protrusion would otherwise be formed). The thermal oxide and/or the deposited oxide can define portions of the IPD region 180. Portions of the thermal oxide and/or portions of the deposited oxide can be etched to expose the silicon wall (e.g., sidewall) of the trench 110 before gate oxidation. In some embodiments, before the portions of the thermal oxide and/or the deposited oxide are etched, an oxidation step can be performed to densify the deposited oxide and/or to continue to oxidize the shield electrode 120 (which can be made of a polysilicon material).

As another example, the shield oxide 130 can be partially etched back (e.g., partially removed) so that the wall (e.g., sidewall) of the trench 110 is not exposed, but is still covered by at least a portion (e.g., a top portion) of the shield oxide 130. The etched out area of the shield oxide 130 can be filled with a deposited oxide (e.g., a thin layer of deposited oxide). The deposited oxide can define portions of the IPD region 180. Portions of the deposited oxide can be etched to expose the silicon wall of the trench 110 before gate oxidation. In some embodiments, before the deposited oxide is etched, an oxidation step can be performed to densify the deposited oxide and/or to oxidize the shield electrode 120 (which can be made of a polysilicon material).

As yet another example, the shield oxide 130 can be etched back (e.g., partially removed) after the shield electrode 120 has been formed within the shielded MOSFET device 100 to expose at least a portion of the silicon wall (e.g., sidewall) of the trench 110 (e.g., the silicon wall defined by the trench 110) and expose at least a portion (e.g., a top portion) of the shield electrode 120. A deposited oxide (e.g., deposited oxide film, thin deposited oxide) can be used to fill gaps (e.g., gaps where a protrusion would otherwise be formed) and cover the exposed portion of the shield electrode 120 and exposed silicon (from the etching). The deposited oxide can define at least a portion of the IPD region 180. Portions of the deposited oxide can be etched to expose the silicon wall of the trench 110 before gate oxidation. In some embodiments, before the deposited oxide is etched, an oxidation step can be performed to densify the deposited oxide and/or to continue to oxidize the shield electrode 120 (which can be made of a polysilicon material). More details related to processing techniques that can be used to produce the IPD region 180 shown in FIG. 1 are described in connection with FIGS. 2 through 7.

In some embodiments, the shielded MOSFET device 100 and other MOSFET devices (not shown) similar to shielded MOSFET device 100 can be included in one or more discrete components. In such embodiments, the shielded MOSFET device 100 and the other MOSFET devices (not shown) can collectively function as a single MOSFET device.

In some embodiments, shielded MOSFET device 100 can be included in (e.g., integrated into), for example, a computing device (not shown). In some embodiments, the computing device can be, for example, a computer, a personal digital assistant (PDA), a memory component (e.g., a hard disk drive), a host computer, an electronic measurement device, a data analysis device, a cell phone, a power supply, an automotive electronic circuit, an electronic device, and/or so forth. In some embodiments, shielded MOSFET device 100 can be used in a variety of application such as switches that connect power supplies to electronic devices having a load.

Although shielded MOSFET device 100 described in connection with FIG. 1 is an N-type shielded MOSFET device, the principles described herein can be implemented in P-type shielded MOSFET devices. For example, the conductivity type (N-type and P-type) can be reversed accordingly for p-channel devices.

FIGS. 2A through 2G are schematic cross-sectional views at various stages of formation of a shielded MOSFET device 200, in accordance with an embodiment. Because the shielded MOSFET device 200 has mirrored features, the shielded MOSFET device 200 will be discussed in terms of a single side. Also, the process sequence depicted by the cross-sectional views shown in FIGS. 2A through 2G are merely exemplary. Accordingly, various processing steps are simplified and/or intermediate processing steps are not shown. Although the processing in FIGS. 2A through 2G is discussed in terms of oxides, in some embodiments, the oxides can be replaced with any type of dielectric material.

Figure 2A:
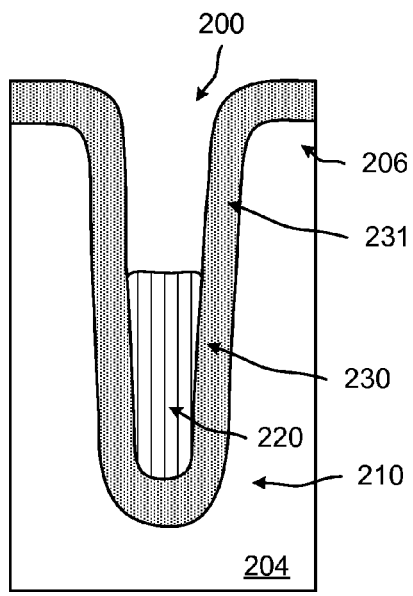
FIGS. 2A through 2G are schematic cross-sectional views at various stages of formation of a shielded MOSFET device, in accordance with an embodiment.

As shown in FIG. 2A, a trench 210 is formed in an epitaxial layer 204 using, for example, masking and/or silicon etch processing techniques. In some embodiments, the trench 210 can be formed using an etching process that can include gaseous etchants such as, for example, $SF_6/He/O_2$ chemistries. In some embodiments, the angle of walls of the trench 210 can range from about 60 degrees relative to a top surface of the epitaxial layer 204 to about 90 degrees (i.e. a vertical sidewall) relative to the top surface of the epitaxial layer 204.

In some embodiments, the epitaxial layer 204 can be, or can include, for example, a doped (e.g., a relatively lightly doped) n-type epitaxial layer disposed over a conductive (e.g., a highly conductive) n-type substrate (not shown). In some embodiments, the epitaxial layer 204 (where the shielded MOSFET device 200 is formed) can be formed (e.g., defined, deposited) over the substrate. In some embodiments, the trench 210 can be configured to terminate within the epitaxial layer 204 or extend deeper to terminate within the substrate (not shown).

A shield oxide 230 lining the trench 210 (e.g., walls and bottom of the trench 210) as well as a surface of a mesa region 206 adjacent the trench 210 are formed. In some embodiments, the shield oxide can be formed using a relatively high temperature oxidation (e.g., dry oxidation) of approximately 800° C. to 1200° C. (e.g., 1,150° C.). In some embodiments, the relatively high temperature of the oxidation can result in a rounding out of the bottom corners of the trench 210 (so that the trench 210 has a rounded bottom as shown in FIG. 2A). In some embodiments, the shield oxide 230 can be formed using any combination of thermally formed (e.g., grown) oxide and/or deposited oxide.

Also as shown in FIG. 2A, polysilicon is deposited to fill the trench 210 using a polysilicon deposition processing technique. The deposited polysilicon can be recessed into the trench 210 to form a shield electrode 220. The shield electrode 220 is disposed within the shield oxide 230 so at least a portion 231 of the shield oxide 230 above the shield electrode 220 is exposed. In some embodiments, the shield oxide 230 can have a thickness (e.g., a bottom thickness at the bottom of the trench 210 and below the shield electrode 220, a side thickness along a wall of the trench 210) of between 100 Å and 2500 Å (e.g., 1,250 Å).

Figure 2B:
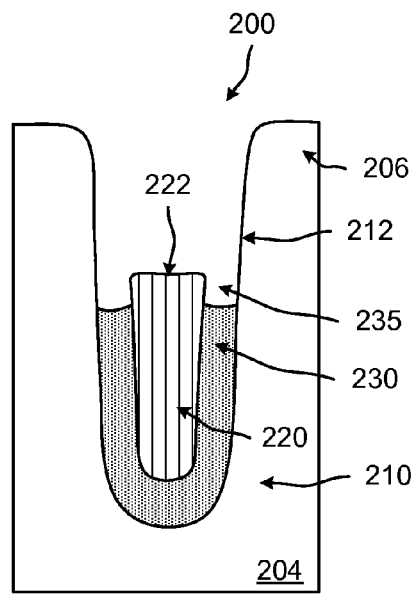

The exposed portions 231 of the shield oxide 230 (e.g., portions of the shield oxide 230 above a top surface 222 of the shield electrode 220) (shown in FIG. 2A) can be removed (e.g., removed using an etch process) so that at least a portion of a wall 212 (e.g., sidewall) of the trench 210 is exposed as shown in FIG. 2B. In other words, as shown in FIG. 2B, the shield oxide 230 is recessed (to form a recess 235 (e.g., a groove, a cavity)) below the top surface 222 of the shield electrode 220 (so that at least a portion of a wall (e.g., a sidewall) of the shield electrode 220 is exposed). As shown in FIG. 2B, the recessed portion extends between the wall 212 (e.g., a sidewall) of the trench 210 and a wall (e.g., a sidewall) of the shield electrode 220. In some embodiments where the shield electrode 220 includes an oxide component, a wet buffered oxide etch can be used to remove the exposed shield oxide 230 to expose the wall 212 of the trench 210. Although not shown, in some embodiments, after the exposed portions 231 of the shield oxide 230 (shown in FIG. 2A) are removed, a thermal oxide can form on the exposed wall 212 of the trench 210. In some embodiments, the thermal oxide can be removed (e.g., removed using an etch process) before subsequent processing steps.

Figure 2C:
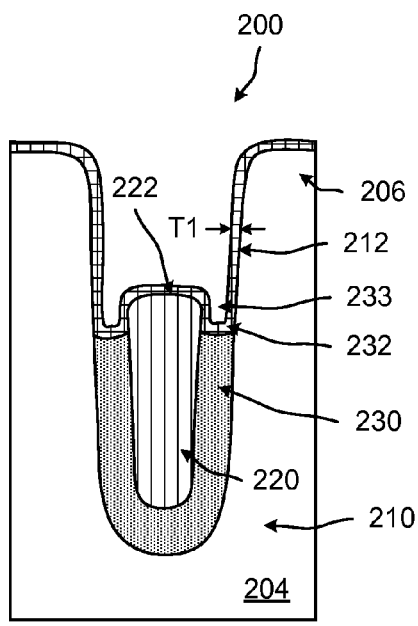

As shown in FIG. 2C, a thermal oxide layer 232 is formed (e.g., formed using a thermal oxidation process) along the exposed walls 212 of the trench 210, over the surface (e.g., top surface) of the mesa regions 206 adjacent (e.g., defining) the trench 210, and over the top portion 222 of the shield electrode 220. The thermal oxidation can oxidize the top portion 222 of shield electrode 220 resulting in a rounded-top profile. The rounded top of the shield electrode 220 can result in a reduced (e.g., minimized) electric field in regions between the shield electrode 220 and a gate electrode 240 (shown in FIG. 2G), which is formed later.

As shown in FIG. 2C, the recess 235 lateral (and/or adjacent) to the shield electrode 220 is not entirely filled by the thermal oxide layer 232. Instead, a recess 233 (e.g., a cavity, a groove) is defined by the thermal oxide layer 232 (which is conformally formed within the recess 235).

In some embodiments, the thermal oxide layer 232 can be formed by performing a low temperature, wet oxidation followed by a high temperature, dry oxidation. In some embodiments, the thermal oxidation can yield a thermal oxide layer 232 with a thickness T1 in the range of approximately 100 to 1500 Å. In some embodiments, the thickness T1 of the thermal oxide layer 232 can be greater than 1500 Å or less than 100 Å.

In some embodiments, a relatively low temperature thermal oxidation approximately 600 to 1000° C. (e.g., 850° C.) can be performed so that a thicker thermal oxide layer 232 can be formed along the top portion of the shield electrode 220 than along the walls 212 (e.g., thickness T1) of the trench 210 and/or over the mesa regions 206. In such embodiments, a thickness ratio in the range of 1.5:1 to 2:1 can be desirable. For example, in some embodiments, the thermal oxidation processing can yield a thermal oxide layer 232 having a thickness of approximately 1500 to 2,000 Å (e.g., 1,850 Å) along the top surface of the shield electrode and a thickness of approximately 1000 to 1,500 Å (e.g., 1,250 Å) along the walls 212 of the trench 210 and/or the mesa surface 206.

Figure 2D:
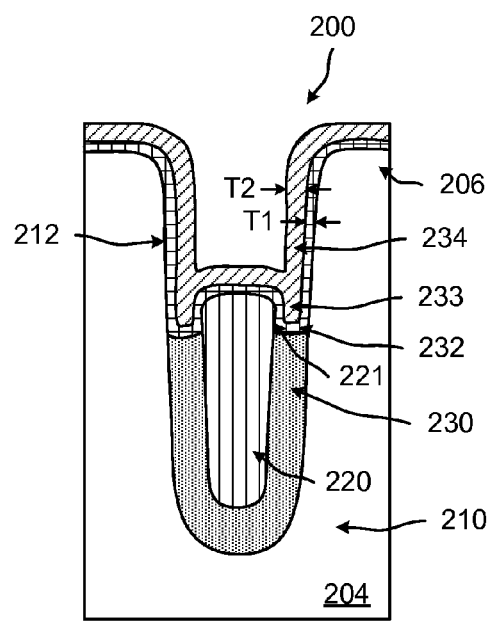

In FIG. 2D, a layer (e.g., a conformal layer) of deposited oxide 234 can be deposited over (e.g., formed over) the thermal oxide layer 232. In some embodiments, the deposited oxide layer 234 can be deposited using chemical vapor deposition (CVD) processing techniques. For example, the deposited oxide layer 234 can be formed using a sub-atmospheric chemical vapor deposition (SACVD) tetraethylorthosilicate (TEOS)/Ozone process at a temperature of approximately 400° C. to 600° C. (e.g., 510° C.) and pressure of approximately 300 to 600 Torr (e.g., 480 Torr).

In some embodiments, the deposited oxide layer 234 can be formed (e.g., deposited) over the thermal oxide layer 232 so that voiding does not (or substantially does not) occur. The deposited oxide layer 234 can be formed so that the recess 233 is entirely filled with the deposited oxide layer 234. The recess 233, if not filled (or at least partially filled), could result in the formation of a protrusion of a gate electrode (not shown). In other words, the recess 233, which is adjacent (and/or lateral) to at least a portion of a wall 221 (e.g., sidewall) of the shield electrode 220 is entirely filled with the deposited oxide layer 234. Accordingly, the deposited oxide layer 234 has a protrusion that is disposed within the recess 233. In some embodiments, a densification process can also be performed to densify the deposited oxide layer 234. In some embodiments, a reflow process can be used to reflow the deposited oxide layer 234, which can reduce voids or defects within the deposited oxide layer 234.

In some embodiments, a thickness T2 of the deposited oxide layer 234 is approximately the same as a thickness T1 of the thermal oxide layer 232. In some embodiments, the thickness T2 of the deposited oxide layer 234 is less than the thickness T1 of the thermal oxide layer 232, or greater than the thickness T1 of the thermal oxide layer 232. In some embodiments, a thickness T2 of the deposited oxide layer 234 is approximately 100 to 1500 Å. In some embodiments, the thickness T2 of the deposited oxide layer 234 can be greater than 1500 Å or less than 100 Å. The thickness T2 of the deposited oxide layer 234 can be thinner than a deposited film that may be used in processes where the entire trench is filled with a deposited film. This can result in reduced processing costs and/or eliminate (or reduce) sensitivities to trench profile, trench fill, and/or voids in the deposited film.

Figure 2E:
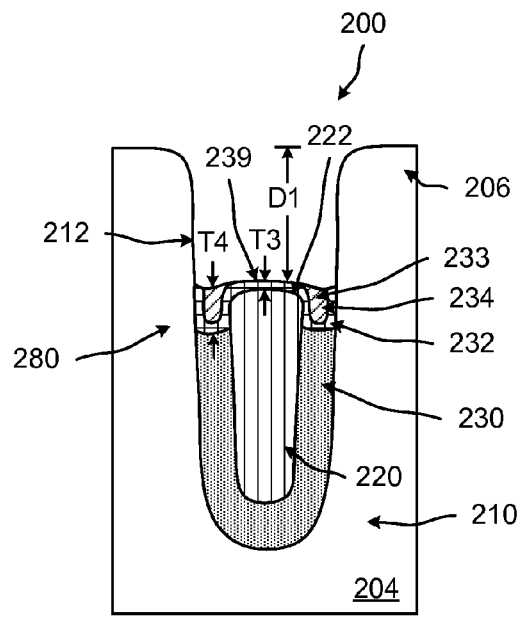

As shown in FIG. 2E, the thermal oxide layer 232 and the deposited oxide layer 234 are removed (e.g., removed using an etching process) down into the trench 210 to a desired depth D1. In some embodiments, portions of the thermal oxide layer 232 and/or portions of the deposited oxide layer 234 over the mesa region 206 and along the wall 212 (e.g., sidewall) of the trench 210 are completely removed. In some embodiments, the thermal oxide layer 232 and/or the deposited oxide layer 234 may not be completely removed.

In some embodiments, the thermal oxide layer 232 and the deposited oxide layer 234 can be etched so that only a portion of the thermal oxide layer 232 remains disposed above the shield electrode 220, and portions of the deposited oxide layer 234 within the recess 233 may also remain. In other words, the thermal oxide layer 232 and the deposited oxide layer 234 can be etched so that all of the deposited oxide layer 234 above the shield electrode 220 is removed, and only a portion of the thermal oxide layer 232 remains disposed above the shield electrode 220.

In some embodiments, removal (e.g., etch back) of the thermal oxide layer 232 and the deposited oxide layer 234 can be performed using an isotropic etch process (e.g., a wet etch process). In some embodiments, the etching can be, or can include, a dry anisotropic plasma etch and/or a wet etch to achieve a desired thickness T3 and/or to ensure that the oxide along the wall 212 (e.g., sidewall) of the trench 210 and/or over the mesa region 206 is completely removed. In some embodiments, a densification process can also be performed to densify the deposited oxide layer 234. In some embodiments, a dry etch and a subsequent densification can be performed and followed by a wet etch.

The portion(s) of the thermal oxide layer 232 and the portion(s) of the deposited oxide layer 234 that remain can be disposed within an inter-poly dielectric (IPD) region 280. Accordingly, the portion(s) of the thermal oxide layer 232 and the portion(s) of the deposited oxide layer 234 that remain within the trench 210 can collectively define an IPD layer (also can be referred to as an IPD dielectric or stack). In some embodiments, the thickness T3 of the IPD layer in the IPD region 280 can be in the range of approximately 100 to 1500 Å. In some embodiments, the thickness T3 of the IPD layer in the IPD region 280 can be greater than 1500 Å or less than 100 Å. A thickness T4 of the IPD layer in the IPD region 280 lateral to the wall (e.g., sidewall) of the shield electrode 220 (which can include at least some portions of the thermal oxide layer 232 and the deposited oxide layer 234) can be greater than the thickness T3 of the IPD layer in the IPD region 280 (which may not include portions from both of the thermal oxide layer 232 and the deposited oxide layer 234) disposed above the shield electrode 220.

As shown in FIG. 2E, a portion 239 of the IPD layer of the IPD region 280 can have a concave surface (e.g., a concave shaped top surface). In some embodiments, the portion 239 of the IPD layer can have a shape that conforms to a shape of the top surface 222 of the shield electrode 220.

In some embodiments, the IPD layer of the IPD region 280 (which is defined by at least a portion of the thermal oxide layer 232 and at least a portion of the deposited oxide layer 234) can have a substantially flat top surface. In other words, a top surface of the IPD layer of the IPD region 280 can be aligned (and/or centered) along (or substantially aligned along) a plane that is orthogonal to (or substantially orthogonal to) a longitudinal axis (such as longitudinal axis B shown in FIG. 2G) along which the trench 210 is aligned (and/or centered).

In some embodiments, the thickness T3 of the oxides disposed above the shield electrode 220 in the IPD region 280 can be greater than or equal to the thickness T1 (shown in FIG. 2D) and/or the thickness T2 (shown in FIG. 2D). In some embodiments, the thickness T3 of the oxides disposed above the shield electrode 220 in the IPD region 280 can be less than the thickness T1 (shown in FIG. 2D) and/or the thickness T2 (shown in FIG. 2D).

In some embodiments, the portion of the wall 212 (e.g., sidewall) of the trench 210 exposed in FIG. 2E can be different than the portion of the wall 212 of the trench 210 expose in FIG. 2B. For example, a length of the portion of the wall 212 of the trench 210 exposed in FIG. 2E can be shorter than a length of the portion of the wall 212 of the trench 210 exposed in FIG. 2B.

Figure 2F:
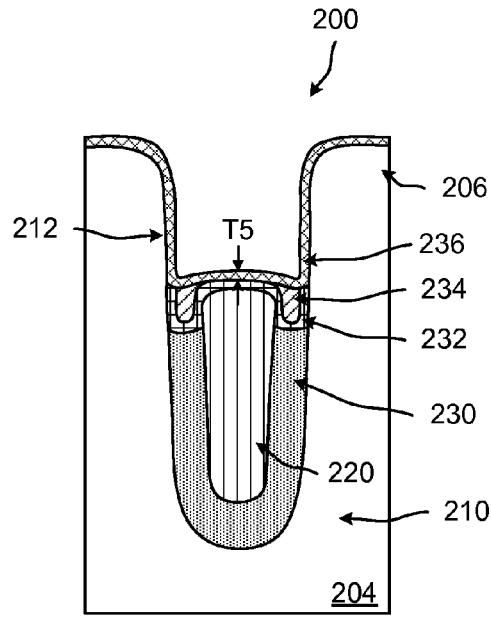

As shown in FIG. 2F, a gate oxide layer 236 extending along the exposed wall 212 of the trench 210, over the IPD layer in the IPD region 280, and over the mesa regions 206 adjacent the trench 206 is formed. Because the IPD formation can be decoupled from the gate oxide layer 236 formation, the gate oxide layer 236 can be independently optimized to have the desired characteristics.

In some embodiments, a thickness T5 of the gate oxide layer 236 can be greater than or equal to the thickness T3 (shown in FIG. 2E), the thickness T1 of the thermal oxide layer 232 (shown in FIG. 2D), and/or the thickness T2 of the deposited oxide layer 234 (shown in FIG. 2D). For example, the thickness T5 of the gate oxide layer 236 can be approximately the same as the thickness T1 of the thermal oxide layer 232. In some embodiments, the thickness T5 of the gate oxide layer 236 can be less than the thickness T3 (shown in FIG. 2E), the thickness T1 of the thermal oxide layer 232 (shown in FIG. 2D), and/or the thickness T2 of the deposited oxide layer 234 (shown in FIG. 2D).

Figure 2G:
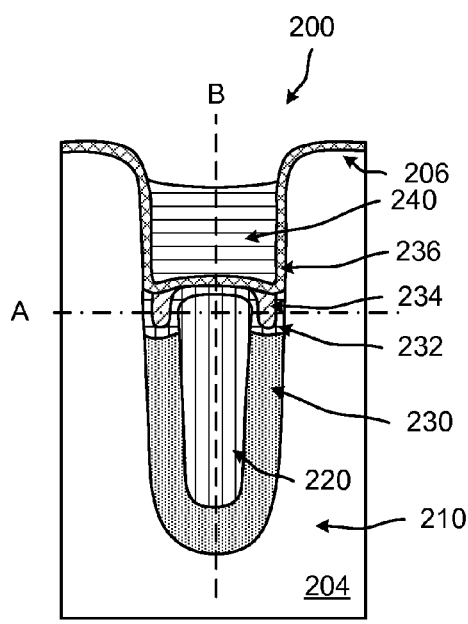

As shown in FIG. 2G, polysilicon can be deposited in the trench to form at least a portion of a gate electrode 240. In some embodiments, the gate electrode 240 can be etched back so that the gate electrode 240 is recessed within trench 210.

Although not shown, in some embodiments, the gate oxide layer 236 extending over the mesa region 206 can be etched to a thickness suitable for body implants and/or source implants. In some embodiments, a blanket body implant and drive-in process can be performed to form p-type body regions along an upper portion of the epitaxial layer 204. In some embodiments, a source implant together with a masking layer (not shown) can be used to form one or more source regions flanking the trench 210.

Although not shown, in some embodiments, an insulating layer (not shown) can be formed over the shielded MOSFET device 200 using one or more processing techniques. In some embodiments, the insulating layer can be a dielectric material including borophosphosilicate glass (BPSG), phosphosilicate glass (PSG), or borosilicate glass (BSG) materials. In some embodiments, the insulating layer can be deposited using, for example, a CVD process until a desired thickness is obtained. In some embodiments, a masking layer can be used to remove at least some portions of the insulating layer to expose surfaces of one or more body regions and/or one or more source regions as defined by the masking layer. In such embodiments, a silicon etch (e.g., dry etch) can be performed to recess the exposed surface regions. The recessed silicon regions can function as, or can allow for, contact openings.

Although not shown, in some embodiments, a heavy body implant can be performed to form one or more self-aligned p-type heavy body regions in one or more body regions. In some embodiments, a reflow of the insulating layer can be performed to obtain a desirable aspect ratio for the contact openings and/or a desirable step coverage for a metal layer which can be formed in a subsequent step to electrically allow for contact to one or more heavy body regions and/or one or more source regions.

Although not shown, in some embodiments, a drain can be formed on a bottom portion of a substrate of the shielded MOSFET device 200. In some embodiments, the drain can be formed before or after one or more contact regions are formed above the shielded MOSFET device 200. In some embodiments, the drain can be formed on the backside by thinning the backside of the substrate using processes such as grinding, polishing, and/or etching. In some embodiments, a conductive layer can be deposited on the backside of the substrate until the desired thickness of the conductive layer of the drain is formed.

The process sequence depicted by the cross-sectional views shown in FIGS. 2A through 2G are merely exemplary and the various steps can be modified and/or performed in a different sequence than that shown. Although the conductivity types described in connection with these figures is related to an n-channel shielded MOSFET device, in some embodiments, the conductivity types can be reversed to make a p-channel shielded MOSFET device.

Figure 2H:
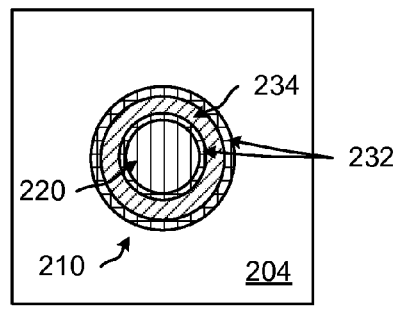
FIG. 2H is a schematic cross-sectional view of the shielded MOSFET device shown in FIG. 2G.

FIG. 2H is a schematic cross-sectional view of the shielded MOSFET device 200 cut along plane A shown in FIG. 2G. As shown in FIG. 2H, a first portion of the thermal oxide layer 232 (intersecting the plane A) is coupled to and disposed around the shield electrode 220. Also, a portion of the deposited oxide layer 234 (intersecting the plane A) is disposed between the first portion of the thermal oxide layer 232 and a second portion of the thermal oxide layer 232. In this embodiment, the deposited oxide layer 234 (intersecting the plane A) defines a concentric ring (e.g., perimeter) (between rings of the thermal oxide layer 232) around the shield electrode 220.

Figure 3:
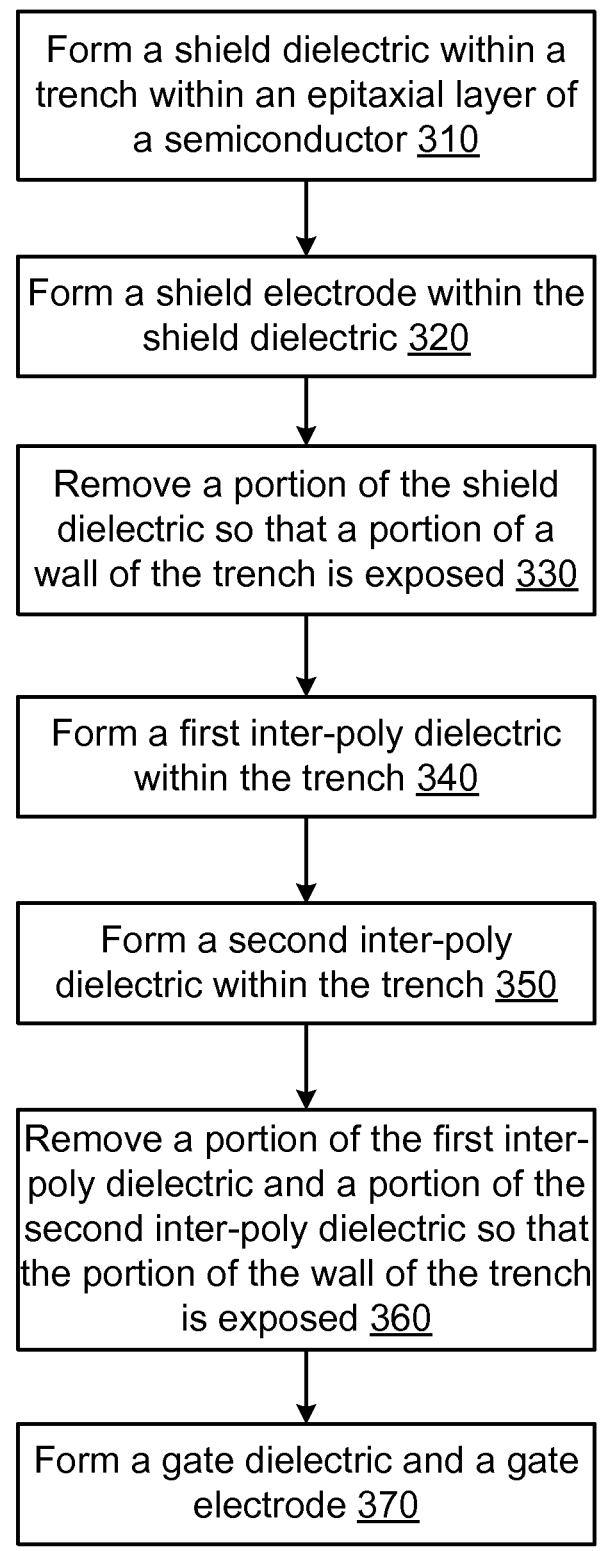
FIG. 3 is a flowchart that illustrates a method for forming the shielded electrode shown in FIGS. 2A through 2H.

FIG. 3 is a flowchart that illustrates a method for forming the shielded electrode shown in FIGS. 2A through 2H. As shown in FIG. 3, a shield dielectric is formed within a trench within an epitaxial layer of a semiconductor (block 310). The trench can be vertically oriented within the epitaxial layer of the semiconductor. In some embodiments, the epitaxial layer can be disposed over a substrate. In some embodiments, the shield dielectric (e.g., shield dielectric 230 shown in FIG. 2A) can be any combination of thermal oxide and deposited oxide. In some embodiments, the shield dielectric can have a relatively uniform thickness within the trench.

A shield electrode is formed within the shield dielectric (block 320). In some embodiments, the shield electrode (e.g., shield electrode 220 shown in FIG. 2A) can be a polysilicon electrode that is deposited within the shield dielectric.

A portion of the shield dielectric is removed so that a portion of a wall of the trench is exposed (block 330). In some embodiments, a top portion of the shield dielectric is removed so that the portion of the wall the trench is exposed (as shown in FIG. 2B). In some embodiments, a portion of the shield dielectric lateral to a wall of the shield electrode is recessed so that a portion of the shield electrode (including a top surface of the shield electrode and at least a portion of the wall of the shield electrode) is exposed.

A first inter-poly dielectric is formed within the trench (block 340). In some embodiments, the first inter-poly dielectric can be a thermal oxide (e.g., thermal oxide layer 232). In some embodiments, the first inter-poly dielectric can be formed within the trench so that the first inter-poly dielectric entirely covers any portion of the shield electrode that has been exposed and the wall of the trench that has been exposed. In some embodiments, the first inter-poly dielectric can be, or can include, a deposited oxide. In some embodiments, a recess (e.g., recess 235 shown in FIG. 2B) lateral to the shield electrode may not be entirely filled by the first inter-poly dielectric.

A second inter-poly dielectric is formed within the trench (block 350). In some embodiments, the second inter-poly dielectric can be a deposited oxide (e.g., deposited oxide layer 234). In some embodiments, the second inter-poly dielectric can be, or can include, a thermal oxide. In some embodiments, the second inter-poly dielectric can be formed within the trench so that the first inter-poly dielectric is entirely covered. In some embodiments, the second inter-poly dielectric can be configured to entirely fill any recesses (e.g., recess 233 shown in FIG. 2C) lateral to the shield electrode.

A portion of the first inter-poly dielectric and a portion of the second inter-poly dielectric are removed so that the portion of the wall of the trench is exposed (block 360). The portion of the first inter-poly dielectric and the portion of the second inter-poly dielectric can be removed so that a relatively flat surface (which is substantially orthogonal to a longitudinal axis along which the trench is aligned (and/or centered)) can be formed. In some embodiments, the first inter-poly dielectric and/or the second inter-poly dielectric can collectively define an IPD layer within an IPD region of the shielded MOSFET device.

A gate dielectric and a gate electrode are formed (block 370). In some embodiments, the gate dielectric can be formed using a thermal oxidation process. In some embodiments, the gate electrode can be formed using a polysilicon material. In some embodiments, a thickness of the gate dielectric can be less than a thickness of an IPD layer disposed above the shield electrode (and formed by at least a portion of the first inter-poly dielectric and/or at least a portion of the second inter-poly dielectric).

FIGS. 4A through 4F are schematic cross-sectional views at various stages of formation of a shielded MOSFET device 400, in accordance with an embodiment. Because the shielded MOSFET device 400 has mirrored features, the shielded MOSFET device 400 will be discussed in terms of a single side. Also, the process sequence depicted by the cross-sectional views shown in FIGS. 4A through 4F are merely exemplary. Accordingly, various processing steps are simplified and/or intermediate processing steps are not shown. Although the processing in FIGS. 4A through 4F is discussed in terms of oxides, in some embodiments, the oxides can be replaced with any type of dielectric material.

FIG. 4A.

Figure 4A:
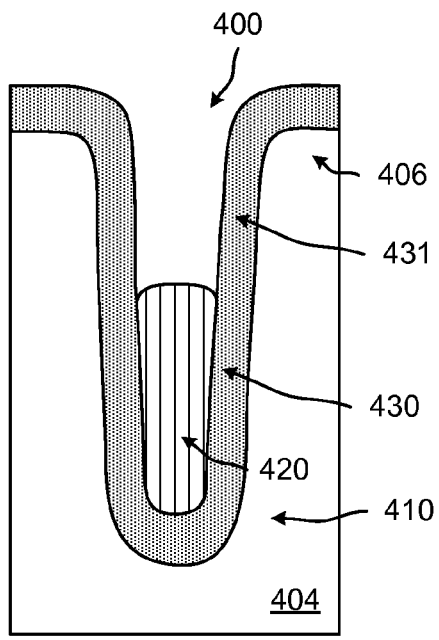

As shown in FIG. 4A, a trench 410 is formed in an epitaxial layer 404 using, for example, masking and/or silicon etch processing techniques. In some embodiments, the trench 410 can be formed using an etching process that can include gaseous etchants such as, for example, $SF_6/He/O_2$ chemistries. In some embodiments, the angle of walls of the trench 410 can range from about 60 degrees relative to a top surface of the epitaxial layer 404 to about 90 degrees (i.e. a vertical sidewall) relative to the top surface of the epitaxial layer 404.

In some embodiments, the epitaxial layer 404 can be, or can include, for example, a doped (e.g., a relatively lightly doped) n-type epitaxial layer disposed over a conductive (e.g., a highly conductive) n-type substrate (not shown). In some embodiments, the epitaxial layer 404 (where the shielded MOSFET device 400 is formed) can be formed (e.g., defined, deposited) over the substrate. In some embodiments, the trench 410 can be configured to terminate within the epitaxial layer 404 or extend deeper to terminate within the substrate (not shown).

A shield oxide 430 lining the trench 410 (e.g., walls and bottom of the trench 410) as well as a surface of a mesa region 406 adjacent the trench 410 are formed. In some embodiments, the shield oxide can be formed using a relatively high temperature oxidation (e.g., dry oxidation) of approximately 800° C. to 1200° C. (e.g., 1,150° C.). In some embodiments, the relatively high temperature of the oxidation can result in a rounding out of the bottom corners of the trench 410 (so that the trench 410 has a rounded bottom as shown in FIG. 4A). In some embodiments, the shield oxide 430 can be formed using any combination of thermally formed (e.g., grown) oxide and/or deposited oxide.

Also as shown in FIG. 4A, polysilicon can be deposited to fill the trench 410 using a polysilicon deposition processing technique. The deposited polysilicon can be recessed into the trench 410 to form a shield electrode 420. The shield electrode 420 is disposed within the shield oxide 430 so at least a portion 431 of the shield oxide 430 above the shield electrode 420 is exposed. In some embodiments, the shield oxide 430 can have a thickness (e.g., a bottom thickness at the bottom of the trench 410 and below the shield electrode 420, a side thickness along a wall of the trench 410) of between 100 Å and 2500 Å (e.g., 1,250 Å).

Figure 4B:
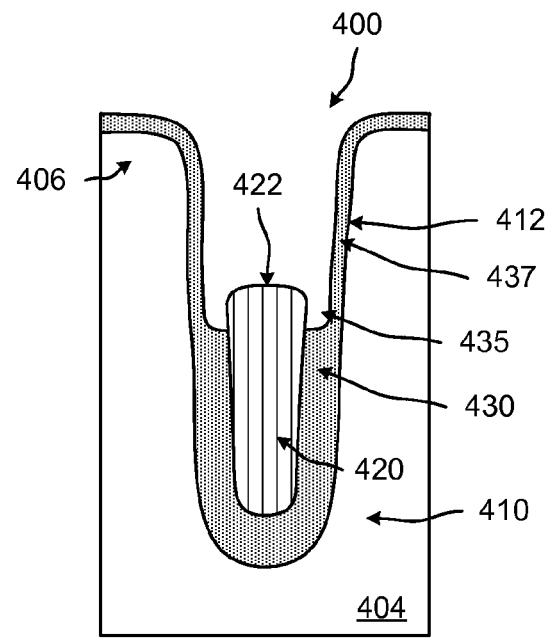

As shown in FIG. 4B, a portion of the exposed portions 431 of the shield oxide 430 (e.g., portions of the shield oxide 430 above a top surface 422 of the shield electrode 420) (shown in FIG. 4A) can be removed (e.g., removed using an etch process). In other words, as shown in FIG. 4B, the shield oxide 430 is recessed (to form a recess 435 (e.g., a groove, a cavity)) below the top surface 422 of the shield electrode 420. In this embodiment, the portion of the shield oxide 430 is removed so that a wall 412 (e.g., sidewall) of the trench 410 remains covered (e.g., is not exposed) by a portion 437 of the shield oxide 430. Thus, the recessed portion extends between the shield electrode 420 and a wall (e.g., a sidewall) of the shield electrode 420. In some embodiments where the shield electrode 420 includes an oxide component, a wet buffered oxide etch can be used to remove the exposed shield oxide 430 to expose the wall 412 of the trench 410.

Figure 4C:
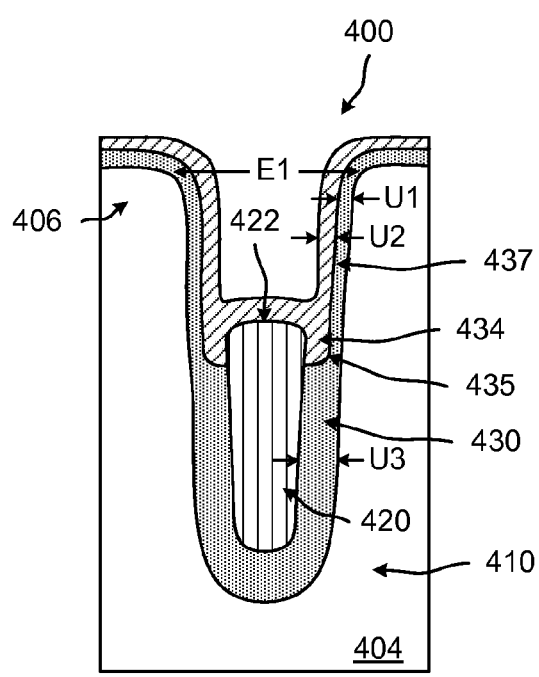

As shown in FIG. 4C, a layer (e.g., a conformal layer) of deposited oxide 434 can be deposited over (e.g., formed over) the exposed portion of the shield electrode 420 and the portion 437 of the shield oxide 430. In some embodiments, the deposited oxide layer 434 can be deposited using chemical vapor deposition (CVD) processing techniques. For example, the deposited oxide layer 434 can be formed using a sub-atmospheric chemical vapor deposition (SACVD) tetraethylorthosilicate (TEOS)/Ozone process at a temperature of approximately 400° C. to 600° C. (e.g., 510° C.) and pressure of approximately 400 to 600 Torr (e.g., 480 Torr).

In some embodiments, the deposited oxide layer 434 can be formed (e.g., deposited) so that voiding does not (or substantially does not) occur. The deposited oxide layer 434 can be formed so that the recess 435 is entirely filled with the deposited oxide layer 434. The recess 435, if not filled (or at least partially filled), could result in the formation of a protrusion of a gate electrode (not shown). In other words, the recess 435, which is adjacent (or lateral) to at least a portion of a wall 421 (e.g., sidewall) of the shield electrode 420 is entirely filled with the deposited oxide layer 434. Accordingly, the deposited oxide layer 434 has a protrusion that is disposed within the recess 435. In some embodiments, a densification process can also be performed to densify the deposited oxide layer 434. In some embodiments, a reflow process can be used to reflow the deposited oxide layer 434, which can reduce voids or defects within the deposited oxide layer 434.

In some embodiments, a thickness U2 of the deposited oxide layer 434 is approximately the same as a thickness U1 of the portion 437 of the shield oxide 430. In some embodiments, the thickness U2 of the deposited oxide layer 434 is less than the thickness U1 of the portion 437 of the shield oxide 430, or greater than the thickness U1 of the portion 437 of the shield oxide 430. In some embodiments, a thickness U2 of the deposited oxide layer 434 is approximately 100 to 1500 Å. In some embodiments, the thickness U2 of the deposited oxide layer 434 can be greater than 1500 Å or less than 100 Å. The thickness U2 of the deposited oxide layer 434 can be thinner than a deposited film that may be used in processes where the entire trench is filled with a deposited film. This can result in reduced processing costs and/or eliminate (or reduce) sensitivities to trench profile, trench fill, and/or voids in the deposited film.

In some embodiments, the thickness U2 of the deposited oxide layer 434 can be defined to fill (e.g., entirely fill) the recess 435. Thus, the thickness U2 of the deposited oxide layer 434 may be less than or equal to a thickness U3 of the shield oxide 430 (which is disposed between the shield electrode 220 and a wall of the trench 410). The thickness U3 of the shield oxide 430 can be approximately the same as a thickness of the shield oxide 430 below the shield electrode 420. In other words, the recess 435 may be entirely filled by the deposited oxide layer 434 when the thickness U2 of the deposited oxide layer 434 is less than the thickness U3 of the shield oxide 430. In some embodiments, the thickness U2 of the deposited oxide layer 434 to fill the recess 435 can be less than half the width of the opening of the recess 435. In some embodiments, the thickness U2 of the deposited oxide layer 434 may be less than half of the width E1 of the opening of the trench 410.

Although not shown in FIG. 4C, in some embodiments, a thermal oxide layer can be formed before the deposited oxide 434 is deposited. Accordingly, the processing of shielded MOSFET device 400 can be modified with processing associated with FIGS. 2C and 2D. Specifically, a thermal oxide layer (not shown) can be formed (e.g., formed using a thermal oxidation process) over the exposed portion of the shield electrode 420 and the portion 437 of the shield oxide 430. In such embodiments, the thermal oxidation can oxidize the top portion 422 of shield electrode 420 resulting in a rounded-top profile. The rounded top of the shield electrode 420 can result in a reduced (e.g., minimized) electric field in regions between the shield electrode 420 and a gate electrode 440 (shown in FIG. 4F), which is formed later.

After the thermal oxide layer (not shown) has been formed, the deposited oxide layer 434 can be formed over the thermal oxide layer. In some embodiments, the deposited oxide layer 434 can be deposited using chemical vapor deposition (CVD) processing techniques. For example, the deposited oxide layer 434 can be formed using a sub-atmospheric chemical vapor deposition (SACVD) tetraethylorthosilicate (TEOS)/Ozone process at a temperature of approximately 400° C. to 600° C. (e.g., 510° C.) and pressure of approximately 400 to 600 Torr (e.g., 480 Torr).

After the deposited oxide layer 434 has been formed over the thermal oxide layer (not shown), processing can proceed in accordance with FIGS. 4D through 4F except that the thermal oxide layer will be processed along with the deposited oxide layer 434. Although not shown, in some embodiments, formation of the deposited oxide layer 434 and thermal oxide layer (not shown) can be reversed.

As shown in FIG. 4D, the portion 437 of the shield oxide 430 and the deposited oxide layer 434 (shown in FIG. 4C) are removed (e.g., removed using an etching process) down into the trench 410 to a desired depth E2. In some embodiments, portions of the portion 437 of the shield oxide 430 and/or portions of the deposited oxide layer 434 over the mesa region 406 and along the wall 412 (e.g., sidewall) of the trench 410 are completely removed. In some embodiments, the portion 437 of the shield oxide 430 and/or the deposited oxide layer 434 may not be completely removed.

In some embodiments, removal (e.g., etch back) of the portion 437 of the shield oxide 430 and the deposited oxide layer 434 can be performed using an isotropic etch process (e.g., a wet etch process). In some embodiments, the etching can be, or can include, a dry anisotropic plasma etch and/or a wet etch to achieve a desired thickness U4 and/or to ensure that the oxide along the wall 412 (e.g., sidewall) of the trench 410 and/or over the mesa region 406 is completely removed. In some embodiments, a densification process can also be performed to densify the deposited oxide layer 434. In some embodiments, a dry etch and a subsequent densification can be performed and followed by a wet etch.

The portion(s) of the portion 437 of the shield oxide 430 and the portion(s) of the deposited oxide layer 434 that remain can be disposed within an inter-poly dielectric (IPD) region 480. Accordingly, the portion(s) of the portion 437 of the shield oxide 430 and the portion(s) of the deposited oxide layer 434 that remain within the trench 410 can collectively define an IPD layer (also can be referred to as an IPD dielectric or stack). In some embodiments, the thickness U4 of the IPD layer in the IPD region 480 can be in the range of approximately 100 to 1500 Å. In some embodiments, the thickness U4 of the IPD layer in the IPD region 480 can be greater than 1500 Å or less than 100 Å. A thickness U5 of the IPD layer in the IPD region 480 lateral to the wall (e.g., sidewall) of the shield electrode 420 (which can include at least some portions of the portion 437 of the shield oxide 430 and the deposited oxide layer 434) can be greater than the thickness U4 of the IPD layer in the IPD region 480 (which may only include the deposited oxide layer 434) disposed above the shield electrode 420.

As shown in FIG. 4D, a portion 439 of the IPD layer of the IPD region 480 can have a concave surface (e.g., a concave shaped top surface). In some embodiments, the portion 439 of the IPD layer can have a shape that conforms to a shape of the top surface 422 of the shield electrode 420.

In some embodiments, the IPD layer of the IPD region 480 (which is collectively defined by at least a portion of the portion 437 of the shield oxide 430 and at least a portion of the deposited oxide layer 434) can have a substantially flat top surface. In some embodiments, the IPD layer of the IPD region 480 (which is defined by at least a portion of the portion 437 of the shield oxide 430 and at least a portion of the deposited oxide layer 434) can have a substantially flat top surface. In other words, a top surface of the IPD layer of the IPD region 480 can be aligned (and/or centered) along (or substantially aligned along) a plane that is orthogonal to (or substantially orthogonal to) a longitudinal axis (such as longitudinal axis C shown in FIG. 4E) along which the trench 410 is aligned (and/or centered).

As shown in FIG. 4E, a gate oxide layer 436 extending along the exposed wall 412 of the trench 410, over the IPD layer in the IPD region 480, and over the mesa regions 406 adjacent the trench 406 is formed. Because the IPD formation can be decoupled from the gate oxide layer 436 formation, the gate oxide layer 436 can be independently optimized to have the desired characteristics.

In some embodiments, a thickness U6 of the gate oxide layer 436 can be greater than or equal to the thickness U1 of the portion 437 of the shield electrode 430 (shown in FIG. 4C), thickness U2 of the deposited oxide layer 434 (shown in FIG. 4C), and/or the thickness U4 of the deposited oxide layer 434 (shown in FIG. 4D). For example, the thickness U6 of the gate oxide layer 436 can be approximately the same as the thickness U4 of the deposited oxide layer 434. In some embodiments, the thickness U6 of the gate oxide layer 436 can be less than the thickness U1 of the portion 437 of the shield electrode 430 (shown in FIG. 4C), thickness U2 of the deposited oxide layer 434 (shown in FIG. 4C), and/or the thickness U4 of the deposited oxide layer 434 (shown in FIG. 4D).

As shown in FIG. 4F, polysilicon can be deposited in the trench to form at least a portion of a gate electrode 440. In some embodiments, the gate electrode 440 can be etched back so that the gate electrode 440 is recessed within trench 410.

Although not shown, in some embodiments, the gate oxide layer 436 extending over the mesa region 406 can be etched to a thickness suitable for body implants and/or source implants. In some embodiments, a blanket body implant and drive-in process can be performed to form p-type body regions along an upper portion of the epitaxial layer 404. In some embodiments, a source implant together with a masking layer (not shown) can be used to form one or more source regions flanking the trench 410.

Although not shown, in some embodiments, an insulating layer (not shown) can be formed over the shielded MOSFET device 400 using one or more processing techniques. In some embodiments, the insulating layer can be a dielectric material including borophosphosilicate glass (BPSG), phosphosilicate glass (PSG), or borosilicate glass (BSG) materials. In some embodiments, the insulating layer can be deposited using, for example, a CVD process until a desired thickness is obtained. In some embodiments, a masking layer can be used to remove at least some portions of the insulating layer to expose surfaces of one or more body regions and/or one or more source regions as defined by the masking layer. In such embodiments, a silicon etch (e.g., dry etch) can be performed to recess the exposed surface regions. The recessed silicon regions can function as, or can allow for, contact openings.

Although not shown, in some embodiments, a heavy body implant can be performed to form one or more self-aligned p-type heavy body regions in one or more body regions. In some embodiments, a reflow of the insulating layer can be performed to obtain a desirable aspect ratio for the contact openings and/or a desirable step coverage for a metal layer which can be formed in a subsequent step to electrically allow for contact to one or more heavy body regions and/or one or more source regions.

Although not shown, in some embodiments, a drain can be formed on a bottom portion of a substrate of the shielded MOSFET device 400. In some embodiments, the drain can be formed before or after one or more contact regions are formed above the shielded MOSFET device 400. In some embodiments, the drain can be formed on the backside by thinning the backside of the substrate using processes such as grinding, polishing, and/or etching. In some embodiments, a conductive layer can be deposited on the backside of the substrate until the desired thickness of the conductive layer of the drain is formed.

The process sequence depicted by the cross-sectional views shown in FIGS. 4A through 4F are merely exemplary and the various steps can be modified and/or performed in a different sequence than that shown. Although the conductivity types described in connection with these figures is related to an n-channel shielded MOSFET device, in some embodiments, the conductivity types can be reversed to make a p-channel shielded MOSFET device.

FIG. 4G is a schematic cross-sectional view of the shielded MOSFET device 400 cut along plane D shown in FIG. 4F. As shown in FIG. 4G, a portion of the deposited oxide layer 434 (intersecting the plane D) is disposed between the shield oxide 430 and the shield electrode 420. In this embodiment, the deposited oxide layer 434 defines a ring (e.g., perimeter) around the shield electrode 420. In embodiments where processing of the MOSFET device 400 is modified with formation of a thermal oxide layer (not shown) before formation of the deposited oxide layer 434, the thermal oxide layer will be disposed between the deposited oxide layer 434 and the shield oxide 430.

Figure 5:
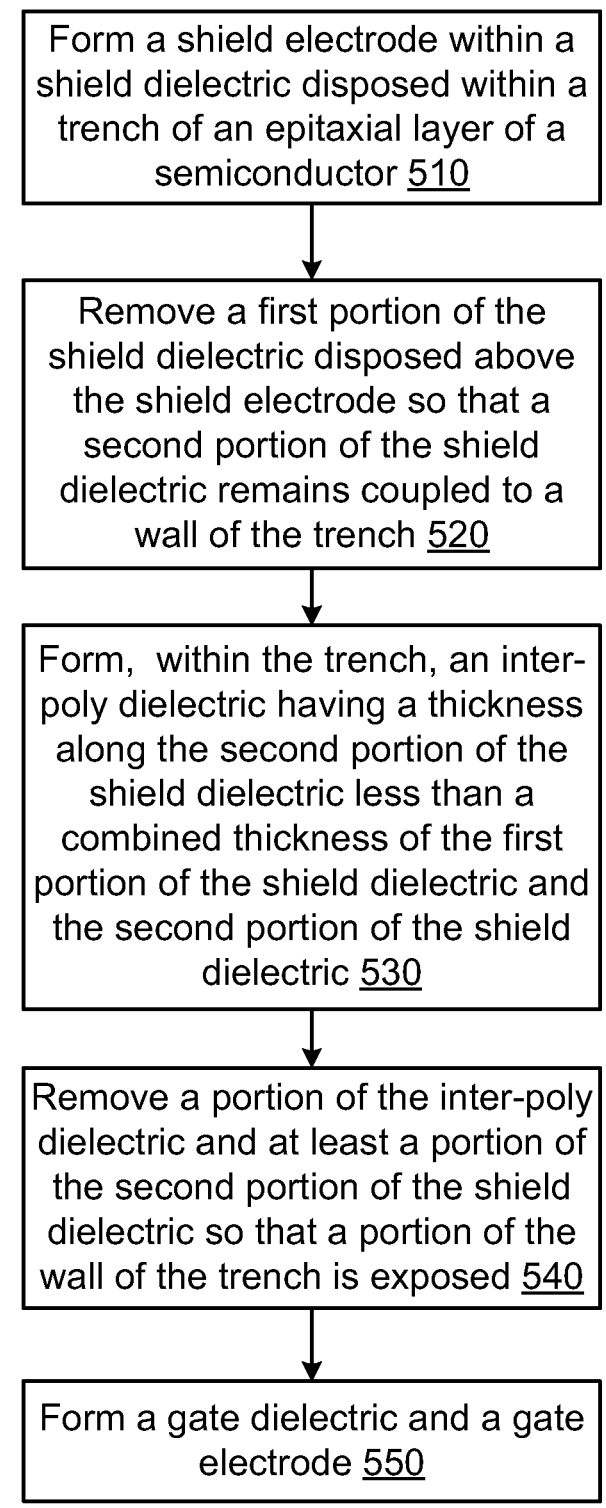
FIG. 5 is a flowchart that illustrates a method for forming the shielded electrode shown in FIGS. 4A through 4G.

FIG. 5 is a flowchart that illustrates a method for forming the shielded electrode shown in FIGS. 4A through 4G. As shown in FIG. 5, a shield electrode is formed within a shield dielectric disposed within a trench of an epitaxial layer of a semiconductor (block 510). The trench can be vertically oriented within the epitaxial layer of the semiconductor. In some embodiments, the epitaxial layer can be disposed over a substrate. In some embodiments, the shield dielectric (e.g., shield dielectric 430 shown in FIG. 4A) can be any combination of thermal oxide and deposited oxide. In some embodiments, the shield dielectric can have a relatively uniform thickness within the trench. In some embodiments, the shield electrode (e.g., shield electrode 420 shown in FIG. 4A) can be a polysilicon electrode that is deposited within the shield dielectric.

A first portion of the shield dielectric disposed above the shield electrode is removed so that a second portion of the shield dielectric remains coupled to a wall of the trench (block 520). In some embodiments, the first portion of the shield electrode can be removed using an etching process. In some embodiments, a portion of the shield dielectric lateral to a wall of the shield electrode is recessed so that a portion of the shield electrode (including a top surface of the shield electrode and at least a portion of the wall of the shield electrode) is exposed.

An inter-poly dielectric having a thickness along the second portion of the shield dielectric less than a combined thickness of the first portion of the shield dielectric and the second portion of the shield dielectric is formed within the trench (block 530). In some embodiments, the inter-poly dielectric can be a deposited oxide (e.g., deposited oxide layer 434). In some embodiments, the inter-poly dielectric can be, or can include, a thermal oxide. In some embodiments, the inter-poly dielectric can be formed within the trench so that the second portion of the shield dielectric is entirely covered. In some embodiments, the inter-poly dielectric can be configured to entirely fill any recesses (e.g., recess 435 shown in FIG. 4C) lateral to the shield electrode. In some embodiments, the inter-poly dielectric can have a thickness along the second portion of the shield dielectric that is greater than or equal to a combined thickness of the first portion of the shield dielectric and the second portion of the shield dielectric. In some embodiments, the inter-poly dielectric can be a deposited oxide (e.g., deposited oxide layer 434).

A portion of the inter-poly dielectric and at least a portion of the second portion of the shield dielectric are removed so that a portion of the wall of the trench is exposed (block 540). In some embodiments, all of the second portion of the shield dielectric is removed. The second portion (or portion thereof) of the shield dielectric and the portion of the inter-poly dielectric can be removed so that a relatively flat surface (which is substantially orthogonal to a longitudinal axis along which the trench is aligned (and/or centered)) can be formed. In some embodiments, the inter-poly dielectric and/or the second portion (or portion thereof) of the shield dielectric can collectively define an IPD layer within an IPD region of the shielded MOSFET device. In some embodiments, the IPD layer can have a concave surface.

A gate dielectric and a gate electrode are formed (block 550). In some embodiments, the gate dielectric can be formed using a thermal oxidation process. In some embodiments, the gate electrode can be formed using a polysilicon material. In some embodiments, a thickness of the gate dielectric can be less than a thickness of an IPD layer disposed above the shield electrode (and formed by at least a portion of the first inter-poly dielectric and/or at least a portion of the second inter-poly dielectric).

FIGS. 6A through 6E are schematic cross-sectional views at various stages of formation of a shielded MOSFET device 600, in accordance with an embodiment. Because the shielded MOSFET device 600 has mirrored features, the shielded MOSFET device 600 will be discussed in terms of a single side. Also, the process sequence depicted by the cross-sectional views shown in FIGS. 6A through 6E are merely exemplary. Accordingly, various processing steps are simplified and/or intermediate processing steps are not shown. Although the processing in FIGS. 6A through 6E is discussed in terms of oxides, in some embodiments, the oxides can be replaced with any type of dielectric material.

As shown in FIG. 6A, a trench 610 is formed in an epitaxial layer 604 using, for example, masking and/or silicon etch processing techniques. In some embodiments, the trench 610 can be formed using an etching process that can include gaseous etchants such as, for example, $SF_6/He/O_2$ chemistries. In some embodiments, the angle of walls of the trench 610 can range from about 60 degrees relative to a top surface of the epitaxial layer 604 to about 90 degrees (i.e. a vertical sidewall) relative to the top surface of the epitaxial layer 604.

In some embodiments, the epitaxial layer 604 can be, or can include, for example, a doped (e.g., a relatively lightly doped) n-type epitaxial layer disposed over a conductive (e.g., a highly conductive) n-type substrate (not shown). In some embodiments, the epitaxial layer 604 (where the shielded MOSFET device 600 is formed) can be formed (e.g., defined, deposited) over the substrate. In some embodiments, the trench 610 can be configured to terminate within the epitaxial layer 604 or extend deeper to terminate within the substrate (not shown).

A shield oxide 630 lining the trench 610 (e.g., walls and bottom of the trench 610) as well as a surface of a mesa region 606 adjacent the trench 610 are formed. In some embodiments, the shield oxide can be formed using a relatively high temperature oxidation (e.g., dry oxidation) of approximately 800° C. to 1200° C. (e.g., 1,150° C.). In some embodiments, the relatively high temperature of the oxidation can result in a rounding out of the bottom corners of the trench 610 (so that the trench 610 has a rounded bottom as shown in FIG. 6A). In some embodiments, the shield oxide 630 can be formed using any combination of thermally formed (e.g., grown) oxide and/or deposited oxide.

Also as shown in FIG. 6A, polysilicon can be deposited to fill the trench 610 using a polysilicon deposition processing technique. The deposited polysilicon can be recessed into the trench 610 to form a shield electrode 620. The shield electrode 620 is disposed within the shield oxide 630 so at least a portion 631 of the shield oxide 630 above the shield electrode 620 is exposed. In some embodiments, the shield oxide 630 can have a thickness (e.g., a bottom thickness at the bottom of the trench 610 and below the shield electrode 620, a side thickness along a wall of the trench 610) of between 100 Å and 2500 Å (e.g., 1,250 Å).

The exposed portions 631 of the shield oxide 630 (e.g., portions of the shield oxide 630 above a top surface 622 of the shield electrode 620) (shown in FIG. 6A) can be removed (e.g., removed using an etch process) so that at least a portion of a wall 612 (e.g., sidewall) of the trench 610 is exposed as shown in FIG. 6B. In other words, as shown in FIG. 6B, the shield oxide 630 is recessed (to form a recess 635 (e.g., a groove, a cavity)) below the top surface 622 of the shield electrode 620 (so that at least a portion of a wall (e.g., a sidewall) of the shield electrode 620 is exposed). As shown in FIG. 6B, the recessed portion extends between the wall 612 (e.g., a sidewall) of the trench 610 and a wall (e.g., a sidewall) of the shield electrode 620. In some embodiments where the shield electrode 620 includes an oxide component, a wet buffered oxide etch can be used to remove the exposed shield oxide 630 to expose the wall 612 of the trench 610. Although not shown, in some embodiments, after the exposed portions 631 of the shield oxide 630 (shown in FIG. 6A) are removed, a thermal oxide can form on the exposed wall 612 of the trench 610. In some embodiments, the thermal oxide can be removed (e.g., removed using an etch process) before subsequent processing steps.

As shown in FIG. 6C, a deposited oxide layer 634 is formed (e.g., formed using a thermal oxidation process) along the exposed walls 612 of the trench 610, over the surface (e.g., top surface) of the mesa regions 606 adjacent (e.g., defining) the trench 610, and over the top portion 622 of the shield electrode 620. In some embodiments, the deposited oxide layer 634 can be deposited using chemical vapor deposition (CVD) processing techniques. For example, the deposited oxide layer 634 can be formed using a sub-atmospheric chemical vapor deposition (SACVD) tetraethylorthosilicate (TEOS)/Ozone process at a temperature of approximately 600° C. to 600° C. (e.g., 710° C.) and pressure of approximately 600 to 600 Torr (e.g., 680 Torr). In some embodiments, the deposited oxide layer 634 can be formed (e.g., deposited) over the thermal oxide layer 632 so that voiding does not (or substantially does not) occur.

As shown in FIG. 6C, the recess 635 lateral to the shield electrode 620 is entirely filled by the deposited oxide layer 634. The recess 635, if not filled (or at least partially filled), could result in the formation of a protrusion of a gate electrode (not shown). In other words, the recess 635, which is adjacent (or lateral) to at least a portion of a wall 621 (e.g., sidewall) of the shield electrode 620 is entirely filled with the deposited oxide layer 634. Accordingly, the deposited oxide layer 634 has a protrusion that is disposed within the recess 635. In some embodiments, a densification process can also be performed to densify the deposited oxide layer 634. In some embodiments, a reflow process can be used to reflow the deposited oxide layer 634, which can reduce voids or defects within the deposited oxide layer 634.

In some embodiments, a thickness R2 of the deposited oxide layer 634 is approximately equal to or less than the same as a thickness R1 of the shield oxide 630 and/or a thickness R3 of the deposited oxide layer 634. In some embodiments, the thickness R2 of the deposited oxide layer 634 can be defined to fill (e.g., entirely fill) the recess 635. Thus, the thickness R2 of the deposited oxide layer 634 may be less than or equal to a thickness R1 of the shield oxide 630 (which is disposed between the shield electrode 220 and a wall of the trench 610). The thickness R1 of the shield oxide 630 can be approximately the same as a thickness of the shield oxide 630 below the shield electrode 620. In other words, the recess 635 may be entirely filled by the deposited oxide layer 634 when the thickness R2 of the deposited oxide layer 634 is less than the thickness R1 of the shield oxide 630. In some embodiments, the thickness R2 of the deposited oxide layer 634 to fill the recess 635 can be less than half the width of the opening of the recess 635. In some embodiments, the thickness R2 of the deposited oxide layer 634 may be less than half of a width of the opening of the trench 610.

In some embodiments, the thickness R2 of the deposited oxide layer 634 is greater than the thickness R1 of the shield oxide 630 and/or a thickness R2 of the deposited oxide layer 634. In some embodiments, a thickness R2 of the deposited oxide layer 634 is approximately 100 to 1500 Å. In some embodiments, the thickness R3 of the deposited oxide layer 634 can be greater than 1500 Å or less than 100 Å. The thickness R2 of the deposited oxide layer 634 can be thinner than a deposited film that may be used in processes where the entire trench is filled with a deposited film. This can result in reduced processing costs and/or eliminate (or reduce) sensitivities to trench profile, trench fill, and/or voids in the deposited film.

As shown in FIG. 6D, at least a portion of the deposited oxide layer 634 (shown in FIG. 6C) is removed (e.g., removed using an etching process) down into the trench 610 to a desired depth. In some embodiments, portions of the deposited oxide layer 634 over the mesa region 606 and along the wall 612 (e.g., sidewall) of the trench 610 are completely removed. In some embodiments, portions of the deposited oxide layer 634 over the mesa region 606 and along the wall 612 (e.g., sidewall) of the trench 610 may not be completely removed.

In some embodiments, removal (e.g., etch back) of the portion of the deposited oxide layer 634 to expose at least a portion of the wall 612 of the trench 610 can be performed using an isotropic etch process (e.g., a wet etch process). In some embodiments, the etching can be, or can include, a dry anisotropic plasma etch and/or a wet etch to achieve a desired thickness R4 and/or to ensure that the oxide along the wall 612 (e.g., sidewall) of the trench 610 and/or over the mesa region 606 is completely removed. In some embodiments, a densification process can also be performed to densify the deposited oxide layer 634. In some embodiments, a dry etch and a subsequent densification can be performed and followed by a wet etch.

The portion(s) of the deposited oxide layer 634 that remain can be disposed within an inter-poly dielectric (IPD) region 680. Accordingly, the portion(s) of the deposited oxide layer 634 that remain within the trench 610 can define an IPD layer (also can be referred to as an IPD dielectric or stack). In some embodiments, the thickness R4 of the IPD layer in the IPD region 680 can be in the range of approximately 100 to 1500 Å. In some embodiments, the thickness R4 of the IPD layer in the IPD region 680 can be greater than 1500 Å or less than 100 Å. A thickness R5 of the IPD layer in the IPD region 680 lateral to the wall (e.g., sidewall) of the shield electrode 620 can be greater than the thickness R4 of the IPD layer in the IPD region 680 (which may only include the deposited oxide layer 634) disposed above the shield electrode 620.

As shown in FIG. 6D, a portion 639 of the IPD layer of the IPD region 680 can have a concave surface (e.g., a concave shaped top surface). In some embodiments, the portion 639 of the IPD layer can have a shape that conforms to a shape of the top surface 622 of the shield electrode 620.

In some embodiments, the IPD layer of the IPD region 680 can have a substantially flat top surface. In some embodiments, the IPD layer of the IPD region 680 (which is defined by at least a portion of the deposited oxide layer 634) can have a substantially flat top surface. In other words, a top surface of the IPD layer of the IPD region 680 can be aligned (and/or centered) along (or substantially aligned along) a plane that is orthogonal to (or substantially orthogonal to) a longitudinal axis (such as longitudinal axis F shown in FIG. 6E) along which the trench 610 is aligned (and/or centered).

Figures 6E, 6F:
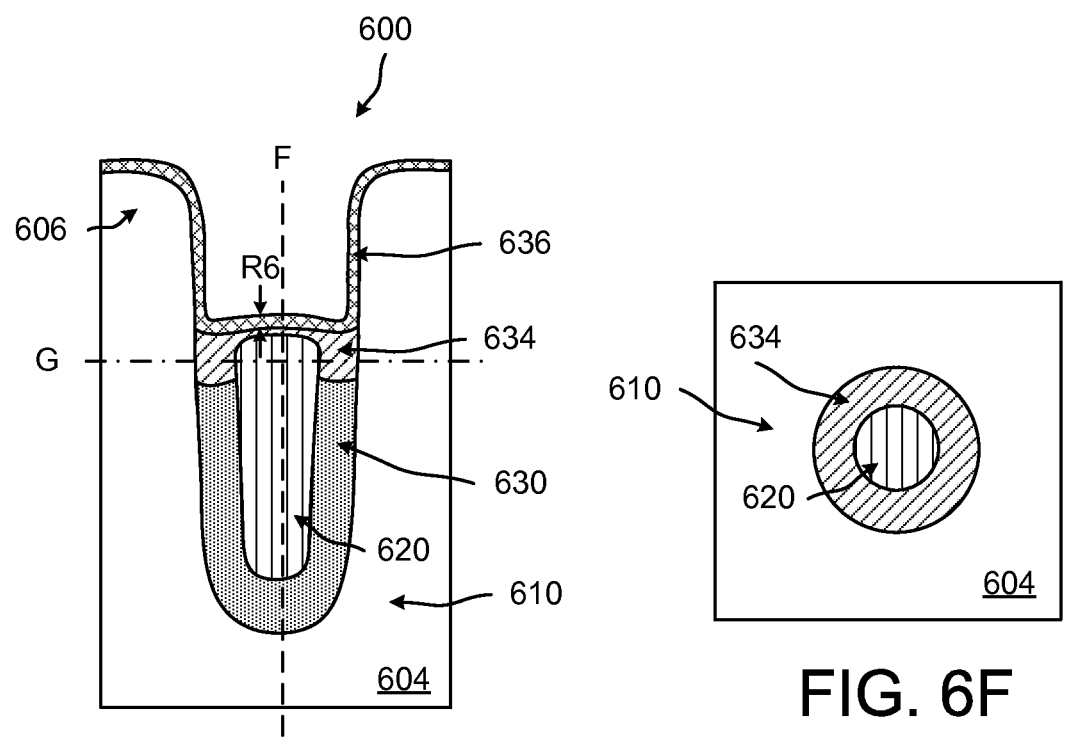

As shown in FIG. 6E, a gate oxide layer 636 extending along the exposed wall 612 of the trench 610, over the IPD layer in the IPD region 680, and over the mesa regions 606 adjacent the trench 606 is formed. Because the IPD formation can be decoupled from the gate oxide layer 636 formation, the gate oxide layer 636 can be independently optimized to have the desired characteristics.

In some embodiments, a thickness R6 of the gate oxide layer 636 can be greater than or equal to the thickness R1 of the shield electrode 630 (shown in FIG. 6C), thickness R2 and/or R3 of the deposited oxide layer 634 (shown in FIG. 6C), and/or the thickness R4 of the deposited oxide layer 634 (shown in FIG. 6D). For example, the thickness R6 of the gate oxide layer 636 can be approximately the same as the thickness R4 of the deposited oxide layer 634. In some embodiments, the thickness R6 of the gate oxide layer 636 can be less than the thickness R1 of the portion 637 of the shield electrode 630 (shown in FIG. 6C), thickness R2 and/or R3 of the deposited oxide layer 634 (shown in FIG. 6C), and/or the thickness R4 of the deposited oxide layer 634 (shown in FIG. 6D).

Although not shown, polysilicon can be deposited in the trench to form at least a portion of a gate electrode 640. In some embodiments, the gate electrode 640 can be etched back so that the gate electrode 640 is recessed within trench 610.

Although not shown, in some embodiments, the gate oxide layer 636 extending over the mesa region 606 can be etched to a thickness suitable for body implants and/or source implants.

In some embodiments, a blanket body implant and drive-in process can be performed to form p-type body regions along an upper portion of the epitaxial layer 604. In some embodiments, a source implant together with a masking layer (not shown) can be used to form one or more source regions flanking the trench 610.

Although not shown, in some embodiments, an insulating layer (not shown) can be formed over the shielded MOSFET device 600 using one or more processing techniques. In some embodiments, the insulating layer can be a dielectric material including borophosphosilicate glass (BPSG), phosphosilicate glass (PSG), or borosilicate glass (BSG) materials. In some embodiments, the insulating layer can be deposited using, for example, a CVD process until a desired thickness is obtained. In some embodiments, a masking layer can be used to remove at least some portions of the insulating layer to expose surfaces of one or more body regions and/or one or more source regions as defined by the masking layer. In such embodiments, a silicon etch (e.g., dry etch) can be performed to recess the exposed surface regions. The recessed silicon regions can function as, or can allow for, contact openings.

Although not shown, in some embodiments, a heavy body implant can be performed to form one or more self-aligned p-type heavy body regions in one or more body regions. In some embodiments, a reflow of the insulating layer can be performed to obtain a desirable aspect ratio for the contact openings and/or a desirable step coverage for a metal layer which can be formed in a subsequent step to electrically allow for contact to one or more heavy body regions and/or one or more source regions.

Although not shown, in some embodiments, a drain can be formed on a bottom portion of a substrate of the shielded MOSFET device 600. In some embodiments, the drain can be formed before or after one or more contact regions are formed above the shielded MOSFET device 600. In some embodiments, the drain can be formed on the backside by thinning the backside of the substrate using processes such as grinding, polishing, and/or etching. In some embodiments, a conductive layer can be deposited on the backside of the substrate until the desired thickness of the conductive layer of the drain is formed.

The process sequence depicted by the cross-sectional views shown in FIGS. 6A through 6F are merely exemplary and the various steps can be modified and/or performed in a different sequence than that shown. Although the conductivity types described in connection with these figures is related to an n-channel shielded MOSFET device, in some embodiments, the conductivity types can be reversed to make a p-channel shielded MOSFET device.

FIG. 6F is a schematic cross-sectional view of the shielded MOSFET device 600 cut along plane G shown in FIG. 6E. As shown in FIG. 6F, the deposited oxide layer 634 (intersecting the plane G) has a portion disposed between a wall of the trench 610 and the shield electrode 620. In this embodiment, the portion of the deposited oxide layer 634 (intersecting the plane G) defines a ring (e.g., perimeter) around the shield electrode 620.

Figure 7:
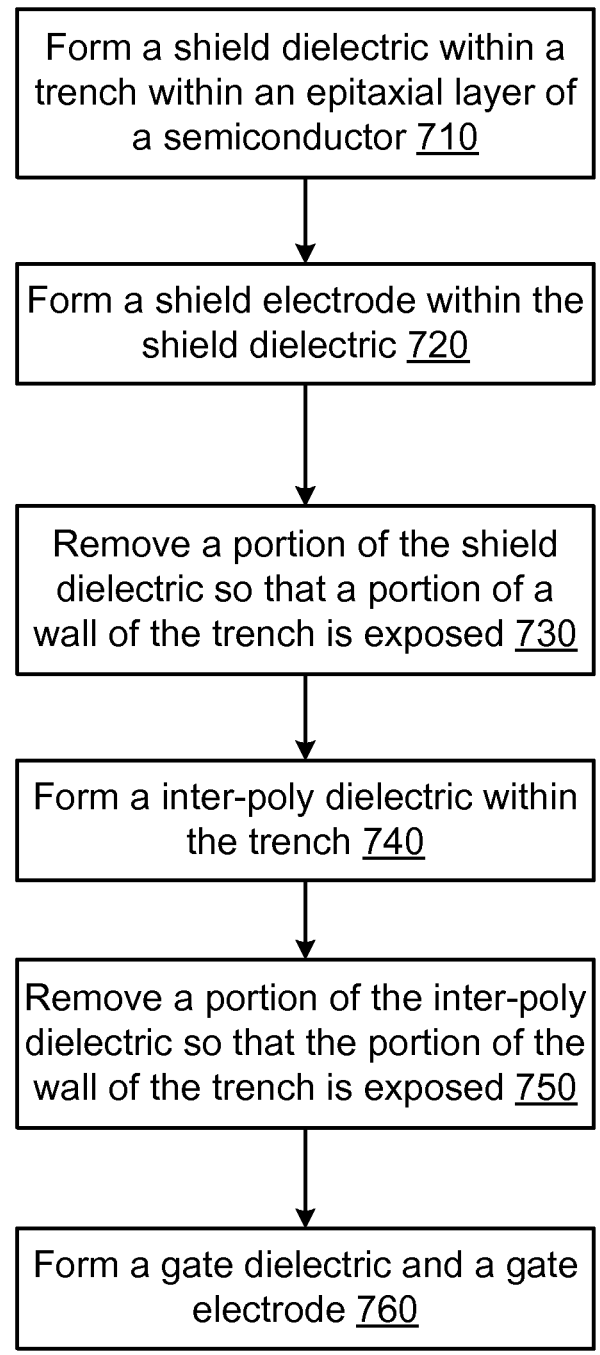
FIG. 7 is a flowchart that illustrates a method for forming the shielded electrode shown in FIGS. 6A through 6E.

FIG. 7 is a flowchart that illustrates a method for forming the shielded electrode shown in FIGS. 6A through 6E. As shown in FIG. 7, a shield dielectric is formed within a trench within an epitaxial layer of a semiconductor (block 710). The trench can be vertically oriented within the epitaxial layer of the semiconductor. In some embodiments, the epitaxial layer can be disposed over a substrate. In some embodiments, the shield dielectric (e.g., shield dielectric 630 shown in FIG. 6A) can be any combination of thermal oxide and deposited oxide.

In some embodiments, the shield dielectric can have a relatively uniform thickness within the trench.

A shield electrode is formed within the shield dielectric (block 720). In some embodiments, the shield electrode (e.g., shield electrode 620 shown in FIG. 6A) can be a polysilicon electrode that is deposited within the shield dielectric.

A portion of the shield dielectric is removed so that a portion of a wall of the trench is exposed (block 730). In some embodiments, a top portion of the shield dielectric is removed so that the portion of the wall the trench is exposed (as shown in FIG. 6B). In some embodiments, a portion of the shield dielectric lateral to a wall of the shield electrode is recessed so that a portion of the shield electrode (including a top surface of the shield electrode and at least a portion of the wall of the shield electrode) is exposed.

An inter-poly dielectric is formed within the trench (block 740). In some embodiments, the inter-poly dielectric can be a deposited oxide (e.g., deposited oxide layer 634). In some embodiments, the inter-poly dielectric can be, or can include, a thermal oxide. In some embodiments, the inter-poly dielectric can be formed within the trench so that the exposed portion of the shield electrode and the shield dielectric (defining the recess) is entirely covered. In some embodiments, the inter-poly dielectric can be configured to entirely fill any recesses (e.g., recess 635 shown in FIG. 6B) lateral to the shield electrode.

A portion of the inter-poly dielectric is removed so that the portion of the wall of the trench is exposed (block 750). The portion of the inter-poly dielectric can be removed so that a relatively flat surface (which is substantially orthogonal to a longitudinal axis along which the trench is aligned (and/or centered)) can be formed. In some embodiments, the inter-poly dielectric can define an IPD layer within an IPD region of the shielded MOSFET device.

A gate dielectric and a gate electrode are formed (block 760). In some embodiments, the gate dielectric can be formed using a thermal oxidation process. In some embodiments, the gate electrode can be formed using a polysilicon material. In some embodiments, a thickness of the gate dielectric can be less than a thickness of an IPD layer disposed above the shield electrode (and formed by at least a portion of the first inter-poly dielectric and/or at least a portion of the second inter-poly dielectric).

Also, while the various embodiments described above can be implemented in silicon, these embodiments can also be implemented in silicon carbide, gallium arsenide, gallium nitride, diamond, and/or so forth. Further, the cross-sectional views of the different embodiments may not be to scale, and as such are not intended to limit the possible variations in the layout design of the corresponding structures. Also, the shielded MOSFET devices can be formed in stripe or cellular architecture including hexagonal transistor cells, square shaped transistor cells, and so forth. In some embodiments, one or more types of semiconductor substrates can be used to produce the shielded MOSFET devices. Some examples of substrates that can be used include, but are not limited to, silicon wafers, epitaxial Si layers, bonded wafers such as used in silicon-on-insulator (SOI) technologies, and/or amorphous silicon layers, all of which may be doped or undoped.

Implementations of the various techniques described herein may be implemented in digital electronic circuitry, or in computer hardware, firmware, software, or in combinations of them. Some implementations may be implemented using various semiconductor processing and/or packaging techniques.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
a shield dielectric disposed within a trench aligned along an axis and disposed within an epitaxial layer of a semiconductor;
a shield electrode disposed within the shield dielectric and aligned along the axis;
a first inter-poly dielectric having a portion intersecting a plane orthogonal to the axis, the plane intersecting the shield electrode;
a second inter-poly dielectric having a portion intersecting the plane and disposed between the first inter-poly dielectric and the shield electrode;
a gate dielectric having a first portion disposed directly on the first inter-poly dielectric; and
a gate electrode disposed above the shield electrode and insulated from the shield electrode by at least the gate dielectric, the gate dielectric having a second portion disposed directly in contact with the gate electrode and disposed directly in contact with a sidewall of the trench.

2. The apparatus of claim 1, wherein the portion of the second inter-poly dielectric is a first portion, and the portion of the first inter-poly dielectric is disposed between a second portion of the second inter-poly dielectric intersecting the plane and the first portion of the second inter-poly dielectric.

3. The apparatus of claim 1, wherein the portion of the first inter-poly dielectric and the portion of the second inter-poly dielectric are disposed lateral to the axis and are disposed above the shield dielectric.

4. The apparatus of claim 1, wherein the portion of the second inter-poly dielectric is a first portion, and the second inter-poly dielectric has a second portion disposed between the portion of the first inter-poly dielectric and the shield dielectric.

5. The apparatus of claim 1, wherein the portion of the second inter-poly dielectric is a first portion, and the second inter-poly dielectric has a second portion disposed between the shield electrode and the portion of the gate dielectric.

6. The apparatus of claim 1, wherein the first inter-poly dielectric is a different type of dielectric than the second inter-poly dielectric.

7. The apparatus of claim 1, wherein the first inter-poly dielectric is a deposited oxide, and the second inter-poly dielectric is a thermally grown oxide.

8. The apparatus of claim 1, wherein the gate dielectric is a thermally grown oxide, and the shield dielectric is at least one of a thermally grown oxide or a deposited oxide.

9. The apparatus claim 1, wherein the first portion of the gate dielectric is disposed directly on the portion of the second inter-poly dielectric.

10. An apparatus, comprising:
a shield dielectric disposed within a trench aligned along an axis within an epitaxial layer of a semiconductor;
a shield electrode disposed within the shield dielectric and aligned along the axis;

an inter-poly dielectric having a portion disposed below a top surface of the shield electrode and intersecting a plane orthogonal to the axis, the plane intersecting the shield electrode, the portion of the shield dielectric is in direct contact with the shield electrode and is in direct contact with a sidewall of the trench;

a gate dielectric having a first portion disposed directly on the inter-poly dielectric; and a gate electrode disposed above the shield electrode and insulated from the shield electrode by at least the gate dielectric, the gate dielectric having a second portion disposed directly in contact with the gate electrode and disposed directly in contact with a sidewall of the trench.

11. The apparatus of claim 10, wherein the portion of the inter-poly dielectric is disposed between the gate dielectric and the shield dielectric such that the gate dielectric is isolated from the shield dielectric.

12. The apparatus of claim 10, wherein the portion of the inter-poly dielectric is a first portion, the sidewall of the trench has a first location intersecting a line orthogonal to the axis and has a second location intersecting the line, the inter-poly dielectric has a second portion that extends along the line from the first location to the second location.

13. An apparatus, comprising:

a shield dielectric disposed within a trench within an epitaxial layer of a semiconductor;

a shield electrode disposed within the shield dielectric;

an inter-poly dielectric having a first portion coupled to the shield dielectric and a second portion coupled to the shield electrode, the inter-poly dielectric having a top surface defining a curve curving in a same direction as at least a portion of a curve of a top surface of the shield electrode;

a gate dielectric having a first portion disposed directly on the top surface of the inter-poly dielectric; and a gate electrode disposed above the shield electrode and insulated from the shield electrode by at least the gate dielectric, the gate dielectric having a second portion disposed directly in contact with the gate electrode and disposed directly in contact with a sidewall of the trench.

14. The apparatus of claim 13, wherein the trench is aligned along an axis, the shield dielectric has a portion intersecting a plane orthogonal to the axis and is disposed between the inter-poly dielectric and the sidewall of the trench, the plane intersects the shield electrode, the portion of the shield dielectric is in direct contact with the inter-poly dielectric and is in direct contact with the sidewall of the trench.

15. The apparatus claim 13, wherein the first portion of the gate dielectric is disposed directly on the portion of the shield dielectric.

16. The apparatus of claim 13, wherein the inter-poly dielectric is a first deposited oxide, the gate dielectric is a first thermally grown oxide, and the shield dielectric is at least one of a second thermally grown oxide or a second deposited oxide.

17. The apparatus of claim 13, wherein the top surface of the inter-poly dielectric, the shield electrode, and the gate dielectric are aligned along a longitudinal axis, the first portion of the inter-poly dielectric is disposed adjacent to a wall of the shield electrode.

18. The apparatus of claim 13, wherein the inter-poly dielectric, when deposited, has a thickness that is less than a thickness of the shield dielectric disposed on the shield electrode.

19. The apparatus of claim 13, wherein the first portion of the gate dielectric is coupled to at least a portion of the shield dielectric.

20. A method, comprising:

forming a shield electrode within a shield dielectric disposed within a trench of an epitaxial layer of a semiconductor, the trench being aligned vertically along an axis;

forming, within the trench, a first inter-poly dielectric having a portion intersecting a plane orthogonal to the axis, the plane intersecting the shield electrode;

forming, within the trench, a second inter-poly dielectric having a portion intersecting the plane and disposed between the first inter-poly dielectric and the shield electrode; and forming a gate dielectric having a first portion disposed directly on the first inter-poly dielectric; and forming a gate electrode disposed above the shield electrode and insulated from the shield electrode by at least the gate dielectric, the gate dielectric having a second portion disposed directly in contact with the gate electrode and disposed directly in contact with a sidewall of the trench.

21. The method of claim 20, wherein the portion of the second inter-poly dielectric is a first portion, and the portion of the first inter-poly dielectric is disposed between a second portion of the second inter-poly dielectric intersecting the plane and the first portion of the second inter-poly dielectric.

22. The method of claim 20, wherein the portion of the first inter-poly dielectric and the portion of the second inter-poly dielectric are disposed lateral to the axis and are disposed above the shield dielectric.

* * * * *